(12) United States Patent
Deng et al.

(10) Patent No.: US 11,619,673 B2
(45) Date of Patent: Apr. 4, 2023

(54) LIFETIME BATTERY TRACKING USING A WIRELESS INTERFACE

(71) Applicant: SENSATA TECHNOLOGIES, INC., Attleboro, MA (US)

(72) Inventors: Jing Deng, Belfast (GB); Stephen C. Millen, Coleraine (IE); Jonathan M. Rigelsford, Sheffield (GB)

(73) Assignee: Sensata Technologies, Inc., Attleboro, MA (US)

( * ) Notice: Subject to any disclaimer, the term of this patent is extended or adjusted under 35 U.S.C. 154(b) by 0 days.

(21) Appl. No.: 17/225,528

(22) Filed: Apr. 8, 2021

(65) Prior Publication Data

US 2021/0318383 A1 Oct. 14, 2021

Related U.S. Application Data

(60) Provisional application No. 63/007,598, filed on Apr. 9, 2020.

(51) Int. Cl.
| | | |
|---|---|---|
| *G01R 31/371* | (2019.01) | |
| *G01R 31/392* | (2019.01) | |
| *G01R 31/396* | (2019.01) | |
| *G06F 17/40* | (2006.01) | |
| *H01M 10/42* | (2006.01) | |

(52) U.S. Cl.
CPC ......... *G01R 31/371* (2019.01); *G01R 31/392* (2019.01); *G01R 31/396* (2019.01); *G06F 17/40* (2013.01); *H01M 10/425* (2013.01); *H01M 2010/4278* (2013.01)

(58) Field of Classification Search
CPC .. G01R 31/371; G01R 31/392; G01R 31/396; G06F 17/40; H01M 10/425; H01M 2010/4278
See application file for complete search history.

(56) References Cited

U.S. PATENT DOCUMENTS

| | | | |
|---|---|---|---|
| 6,006,077 A * | 12/1999 | Shull | H04B 17/318 455/226.2 |
| 8,675,535 B2 | 3/2014 | Finlow-Bates et al. | |
| 9,740,892 B2 | 8/2017 | Lombardi et al. | |
| 10,470,008 B2 | 11/2019 | Arunachalam et al. | |
| 2013/0154387 A1* | 6/2013 | Lee | H02J 7/00034 307/104 |
| 2015/0105099 A1* | 4/2015 | Luo | G01S 5/0252 455/456.1 |
| 2015/0334534 A1 | 11/2015 | Babu et al. | |

(Continued)

OTHER PUBLICATIONS

International Search Report and Written Opinion, PCT/US2021/026181, dated Aug. 4, 2021, 11 pages.

*Primary Examiner* — Kyle R Quigley
(74) *Attorney, Agent, or Firm* — Mark H. Williams

(57) ABSTRACT

Methods, apparatuses, systems, and computer program products for lifetime battery tracking using a wireless interface are disclosed. During production and assembly of a battery pack, the location of a battery module in a production line is tracked using detected signal strengths from a wireless transmitter of a battery module monitoring system. During the life of the battery module, the battery module monitoring system provides battery usage data that can be combined with vehicle data for diagnostic analysis.

20 Claims, 25 Drawing Sheets

(56) References Cited

U.S. PATENT DOCUMENTS

| | | | |
|---|---|---|---|
| 2015/0334676 A1* | 11/2015 | Hart | H04W 64/003 |
| | | | 455/456.1 |
| 2018/0188332 A1* | 7/2018 | Newman | B60K 35/00 |
| 2018/0301770 A1* | 10/2018 | Nakaya | G06Q 50/06 |
| 2019/0044575 A1* | 2/2019 | Assem | H04W 4/80 |
| 2019/0331760 A1* | 10/2019 | Nishimura | G01S 5/14 |
| 2020/0217916 A1* | 7/2020 | Tseng | G01S 3/043 |
| 2020/0381923 A1* | 12/2020 | Chow | H01M 50/249 |
| 2021/0136600 A1* | 5/2021 | Le | H04B 17/318 |

* cited by examiner

Receive, By A Controller, Respective First Received Signal Strength Indicator (RSSI) Information From A Plurality Of Access Points (APs), The Respective First RSSI Information Corresponding To A Respective First Signal Received By Each AP From A Battery Pack Component, The Battery Pack Component Including At Least One Of A Battery Module Monitoring System (MMS) And A Wireless Network Controller (WNC) 802

Determine, By The Controller In Dependence Upon The Respective First RSSI Information, A First Location Of The Battery Pack Component 804

Receive, By The Controller, Respective Second RSSI Information From The Plurality Of APs, The Respective Second RSSI Information Corresponding To A Respective Second Signal Received By Each AP From The Battery Pack Component 806

Determine, By The Controller In Dependence Upon The Respective Second RSSI Information, A Second Location Of The Battery Pack Component 808

FIG. 8

LIFETIME BATTERY TRACKING USING A WIRELESS INTERFACE

CROSS-REFERENCE TO RELATED APPLICATION

This application is a non-provisional application for patent entitled to a filing date and claiming the benefit of earlier-filed U.S. Provisional Patent Application Ser. No. 63/007,598, filed Apr. 9, 2020.

BACKGROUND

Electric vehicles are powered by high voltage battery systems including multiple cells. Battery management systems are used to monitor various attributes of the cells, including voltage, temperature, and current, in order to ensure proper and safe operation of the battery. In a conventional wired battery management system, multiple cells of the battery are grouped into modules, with each module having a component to monitor these attributes. Wireless battery management systems provide more flexibility in design but require a new mechanism for tracking the location of the battery modules during battery pack assembly since they are not wired. It is also important to track the usage of batteries as this significantly affects the life of the battery. Traditionally, the battery cells are only monitored when they are connected to a battery management system. However, once the cells are disconnected, all the historical usage information is lost. This causes challenges and efforts to re-test the cells to obtain their health status.

SUMMARY OF INVENTION

Embodiments of the present disclosure are directed to lifetime battery tracking using a wireless interface. The wireless interfaces of a battery pack, including but not limited to the battery module monitoring system (MMS) interface and a wireless network controller (WNC) interface, may allow the battery modules in the battery pack to be tracked and analyzed beginning with assembly into a battery pack, to assembly into a vehicle, and through operation of the vehicle.

In one example embodiment, in a battery pack production line, a plurality of access points (AP) disposed on the production line receive a signal from a battery module monitoring system or a wireless network controller connected to the battery MMS. Each module monitoring system determines received signal strength indicator (RSSI) information and an identifier for each AP. When the battery MMS detects a change, it broadcasts its MMS identifier, which is received by the APs and used to triangulate a location of the MMS in the production line. In another example embodiment, battery module information indicating battery usage is collected by a vehicle control system. The vehicle control system associates the battery module information and vehicle information, such as speed and location, and provides the associated data to an external device such as a cloud server or a diagnostic device.

In a particular embodiment in accordance with the present invention, an effective mechanism to track both the location and usage of each individual cells through a 2.4 GHz wireless interface is disclosed. The tracking may start when a cell monitored unit (CMU) is attached to the battery cell at the end of its production line or when the cells are assembled to build a battery module and monitored by a battery MMS. As modular design is still the most popular approach in the near future, the following description is based on MMS approach. Additionally, both CMU and MMS have microcontroller and memory on them, making it possible to log relevant information on how the battery is being used. Under normal battery pack operating conditions, the MMS communicate with a wireless network controller (WNC) which in turn communicates to the BMS. This information may be very useful to diagnose the cells and quickly find out its health and charge status.

In a particular embodiment, lifetime battery tracking using a wireless interface includes a battery component monitor receiving a first set of signals from a first set of access points (APs) of a plurality of APs and subsequent to receiving the first set of signals, receiving a second set of signals from a second set of APs of the plurality of APs. In this embodiment, the battery component monitor determines whether first information associated with the first set of signals is different than second information associated with the second set of signals. In response to determining that the first information is different than the second information, the battery component monitor broadcasts to one or more APs of the plurality of APs, a signal that indicates a unique identifier for the battery component monitor.

In another embodiment, lifetime battery tracking using a wireless interface includes an access point (AP) receiving from a battery component monitor, a signal indicating the battery component monitor has detected a change in data received from a plurality of APs. In this example embodiment, the plurality of APs includes the AP and the signal includes a unique identifier for the battery component monitor. The AP determines a strength of the signal from the battery component monitor. In response to receiving the signal indicating the battery component monitor has detected a change in data received from the plurality of APs, the AP transmits to a tracking controller, the unique identifier and an indication of the determined strength of the battery component monitor.

In another embodiment, lifetime battery tracking using a wireless interface includes a tracking controller, for each access point (AP) of one or more APs, receiving from the AP, a set of data that includes received signal strength indicator (RSSI) information that indicates the strength of a signal received by the AP from a first battery component monitor. In this example embodiment, the tracking controller determines, in dependence upon the sets of data received from the one or more APs, a location of the first battery component monitor.

In another embodiment, lifetime battery tracking using a wireless interface includes a vehicle control system receiving from a battery management system (BMS), battery module information for the BMS and generating vehicle information. In this example embodiment, the vehicle control system, generates backup data that includes the vehicle information and the battery module information for the BMS and provides the backup data to an external device.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

BRIEF DESCRIPTION OF DRAWINGS

FIG. 8 is a flowchart to illustrate another implementation of a method for lifetime battery tracking using a wireless interface in accordance with the present disclosure;

DESCRIPTION OF EMBODIMENTS

The terminology used herein for the purpose of describing particular examples is not intended to be limiting for further examples. Whenever a singular form such as "a", "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises", "comprising", "includes" and/or "including", when used, specify the presence of the stated features, integers, steps, operations, processes, acts, elements and/or components, but do not preclude the presence or addition of one or more other features, integers, steps, operations, processes, acts, elements, components and/or any group thereof.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e., only A, only B, as well as A and B. An alternative wording for the same combinations is "at least one of A and B". The same applies for combinations of more than two elements.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

Figure 1:
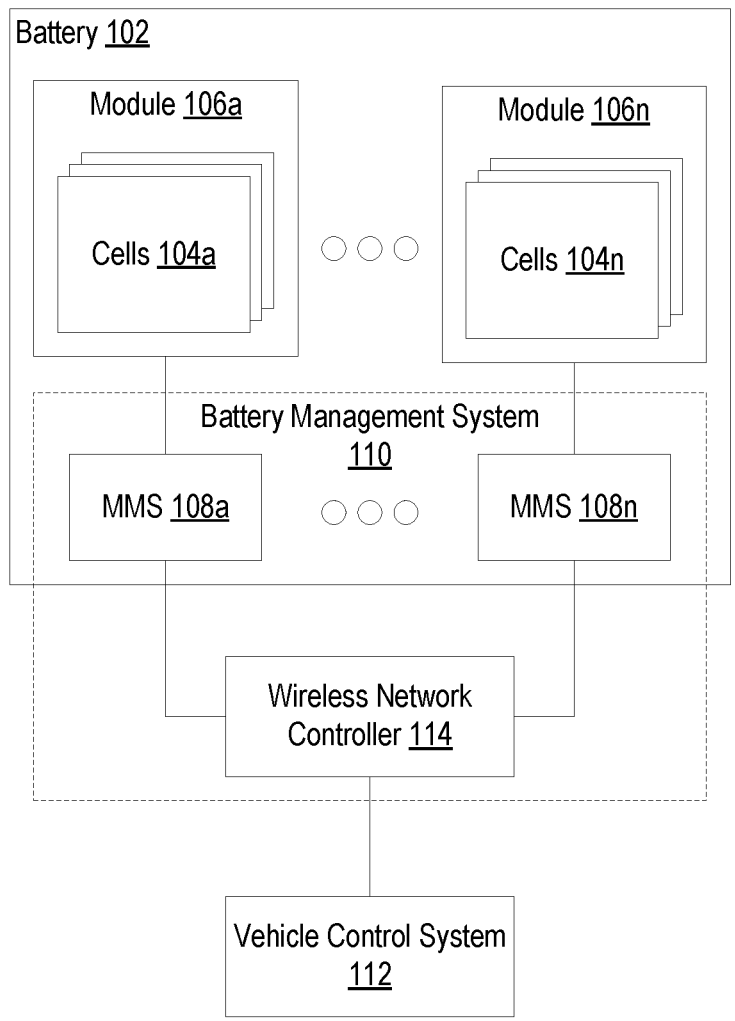
FIG. 1 sets forth a block diagram of a system for lifetime battery tracking using a wireless interface according to embodiments of the present disclosure.

Exemplary methods, systems, apparatuses, and computer program products for lifetime battery tracking using a wireless interface in accordance with the present disclosure are described with reference to the accompanying drawings, beginning with FIG. 1. FIG. 1 sets forth a diagram of a system for lifetime battery tracking using a wireless interface according to embodiments of the present disclosure. The system includes a battery (102), such as a high voltage battery for use in an electric vehicle. The battery (102) includes a plurality of cells (104a-n), such as Lithium-ion (Li-ion) cells. The cells (104a-n) are grouped into modules (106a-n) such that each module (106a-n) comprises a corresponding subset of the cells (104a-n). The cells (104a-n) may be physically grouped into modules (106a-n) using a casing, chassis, or other enclosure. The cells (104a-n) may also be logically grouped into modules (106a-n) by virtue of distinct groupings of cells (104a-n) being monitored by a distinct module monitoring system (108a-n), as will be described below.

The system also includes a battery management system (110). The battery management system (110) monitors various attributes of the cells (104a-n) and provides battery sensor data indicating these attributes to a vehicle control system (112). The battery management system (110) includes a plurality of module monitoring systems (MMS) (108a-n). Each MMS (108a-n) is configured to monitor a corresponding module (106a-n) of cells (104a-n). For example, each module (106a-n) may have a MMS (108a-n) attached to a chassis, base, tray, or other mechanism holding the cells (104a-n) of the module (106a-n). Each MMS (108a-n) includes sensors to measure various attributes of the cells (104a-n) of its corresponding module (106a-n). Such attributes may include voltage, current, temperature, and potentially other attributes. The attributes are indicated in battery sensor data generated by the MMS (108a-n). Each MMS (108a-n) is configured to operate at a particular Automotive Safety Integrity Level (ASIL), such as ASIL-D. As an example, each MMS (108a-n) may be configured to meet, at minimum, ASIL-QM standards, allowing for reduced cost and complexity.

Each MMS (108a-n) encodes its battery sensor data for transmission as a wireless signal and transmits its battery sensor data using a wireless communication channel to a wireless network controller (WNC) (114) (e.g., a 2.4 Ghz wireless channel). The WNC (114) may be implemented using a wireless transceiver integrated circuit for reduced cost and complexity. The wireless communication channel has no intervening components between the MMS (108a-n) and WNC (114), preventing faults from being introduced into the battery sensor data from an intermediary communications component. The WNC (114) then sends the battery sensor data received from the MMSs (108a-n) to a vehicle control system (VCS) (112) using a wired or wireless communications channel. The VCS (112) may include a central "computer" of a vehicle. The VCS (112) may be a control system or may refer collectively to one or more vehicle subsystems. In an embodiment, the VCS (112) includes a battery management system controller (BMSC). The WNC (114) may communicate with the VCS (112), for example, over a controller area network (CAN) bus or a serial peripheral interface (SPI) bus. The WNC (114) may include a universal asynchronous receiver/transmitter (UART) for communicating with the VCS (112).

To ensure the security and integrity of wireless communications between the MMS (108a-n) and WNC (114), each MMS (108a-n) generates one or more portions of integrity data for the battery sensor data prior to sending to the WNC (114). The integrity data is sent with the battery sensor data to the WNC (114) (e.g., as a header or separate portion of a data payload). The WNC (114) may then validate received battery sensor data using the integrity data. The integrity data may include a message authentication code for the battery sensor data. The message authentication code may include a message authentication code generated by a key. For example, each MMS (108a-n) may share a same key, or each have distinct keys for generating a message authentication code. The WNC (114) may then generate a message authentication code based on the battery sensor data using the appropriate key and compare the generated message authentication code to the received message authentication code. The integrity data may include an identifier associated with the MMS (108a-n) generating the battery sensor data. The identifier may include a user-defined identifier, serial number, or other unique identifier for a particular MMS (108a-n). The WNC (114) may validate the battery sensor data by comparing the identifier to one or more known identifiers for each MMS (108a-n).

Figure 2:
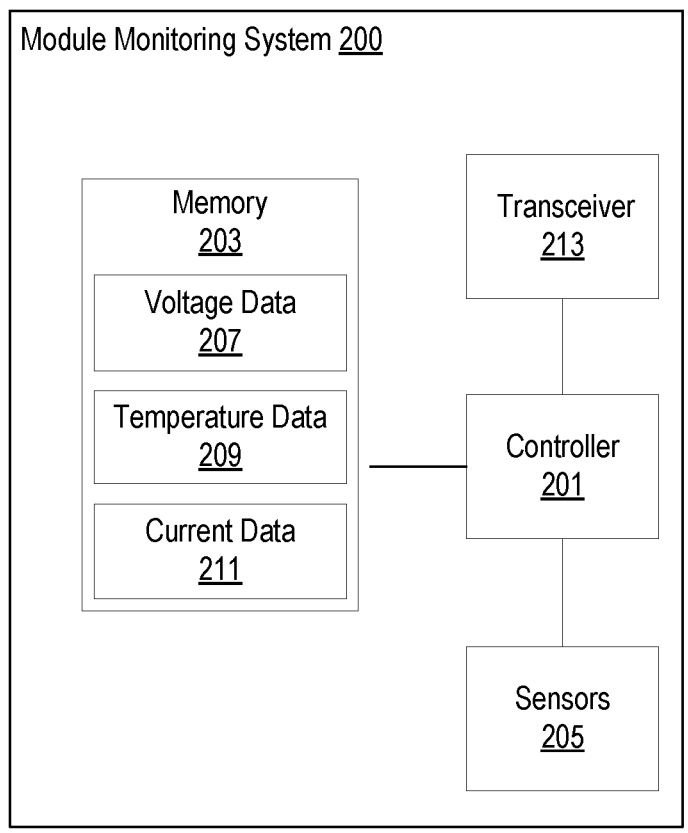
FIG. 2 illustrates a block diagram of a module monitoring system for lifetime battery tracking using a wireless interface according to embodiments of the present disclosure.

For further explanation, FIG. 2 sets forth a block diagram of a module monitoring system (MMS) (200) (e.g., a module monitoring system (108a-n) of FIG. 1) for lifetime battery tracking using a wireless interface according to embodiments of the present disclosure. The MMS (200) includes a controller (201) coupled to a memory (203). The controller (201) is configured to obtain sensor readings from sensors (205) (e.g., voltage sensors, temperature sensors, current sensors) to generate battery sensor data (e.g., voltage data (207), temperature data (209), current data (211)). The controller (201) may include or implement a microcontroller, an Application Specific Integrated Circuit (ASIC), a digital signal processor (DSP), a programmable logic array (PLA) such as a field programmable gate array (FPGA), or other data computation unit in accordance with the present disclosure. The battery sensor data (e.g., voltage data (207), temperature data (209), current data (211)) may be stored in the memory (203). The memory (203) may be a non-volatile memory such as flash memory.

The sensors (205) are configured to measure attributes (e.g., voltage, temperature, current) of cells of a module (e.g., cells (104a-n) of a module (106a-n)) on which the MMS (200) is installed. For bidirectional wireless communication with a wireless network controller (e.g., a WNC (114) of FIG. 1), the MMS (200) includes a transceiver (213) coupled to the controller (201).

Figure 3:
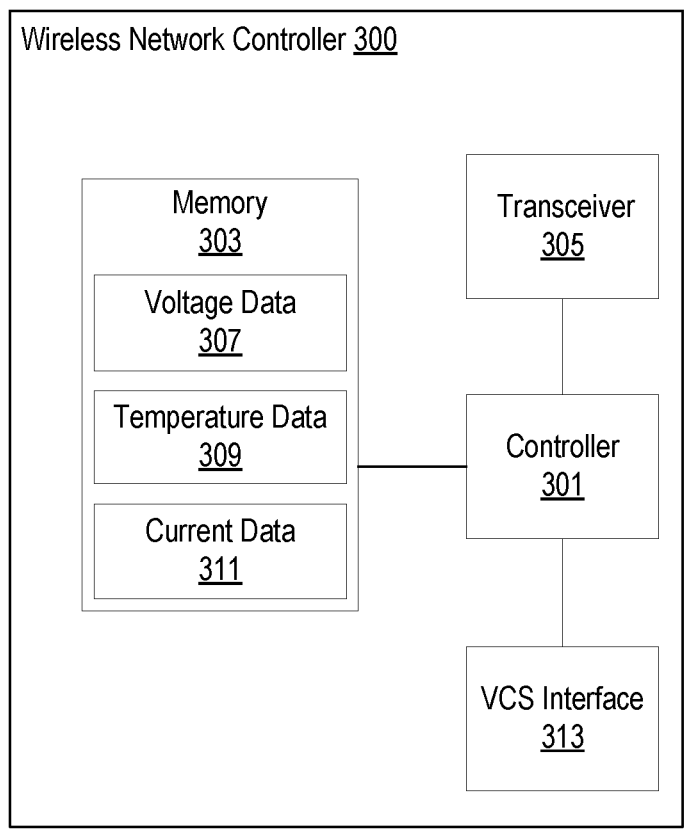
FIG. 3 illustrates a block diagram of a wireless network controller for lifetime battery tracking using a wireless interface according to embodiments of the present disclosure.

For further explanation, FIG. 3 sets forth a block diagram of a wireless network controller (WNC) (300) (e.g., a wireless network controller (114) of FIG. 1) for lifetime battery tracking using a wireless interface according to embodiments of the present disclosure. The WNC (300) includes a controller (301) coupled to a memory (303). The controller (301) is configured to request and receive, via a transceiver (305) from a plurality of MMSs (200), sensor data (e.g., voltage data (307), temperature data (309), current data (311)). The controller (301) may include or implement a microcontroller, an Application Specific Integrated Circuit (ASIC), a digital signal processor (DSP), a programmable logic array (PLA) such as a field programmable gate array (FPGA), or other data computation unit in accordance with the present disclosure. The battery sensor data (e.g., voltage data (307), temperature data (309), current data (311)) may be stored in the memory (303). The memory (303) may be a non-volatile memory such as flash memory. The controller (301) is further configured to provide formatted battery sensor data to a BMS controller (e.g., a BMS controller (412) of FIG. 6) or a vehicle control system (e.g., a VCS (112) of FIG. 1) via an interface (313). The interface may include a bus or other wired connection to a BMS controller or VCS.

Figure 4A:
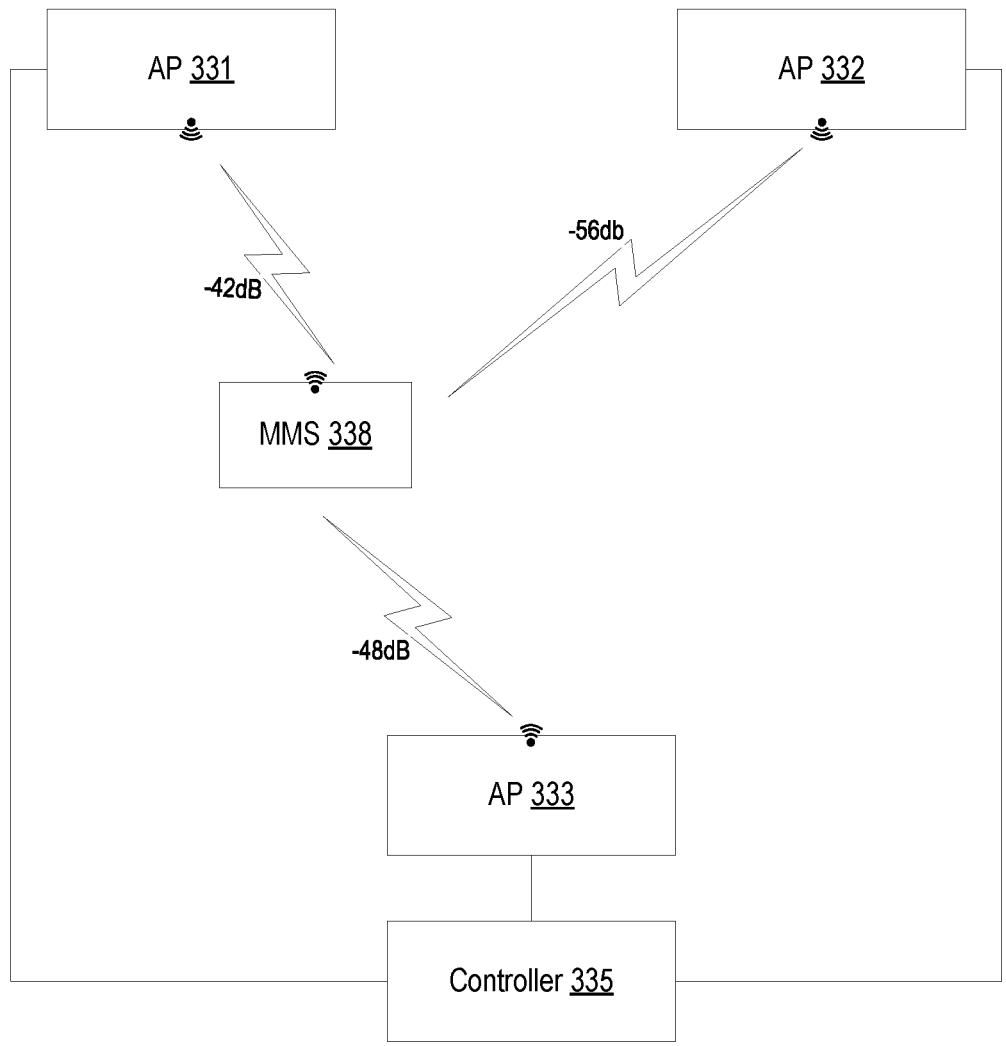
FIG. 4A illustrates a block diagram of another example system for lifetime battery tracking using a wireless interface in accordance with the present disclosure.
Figure 4B:
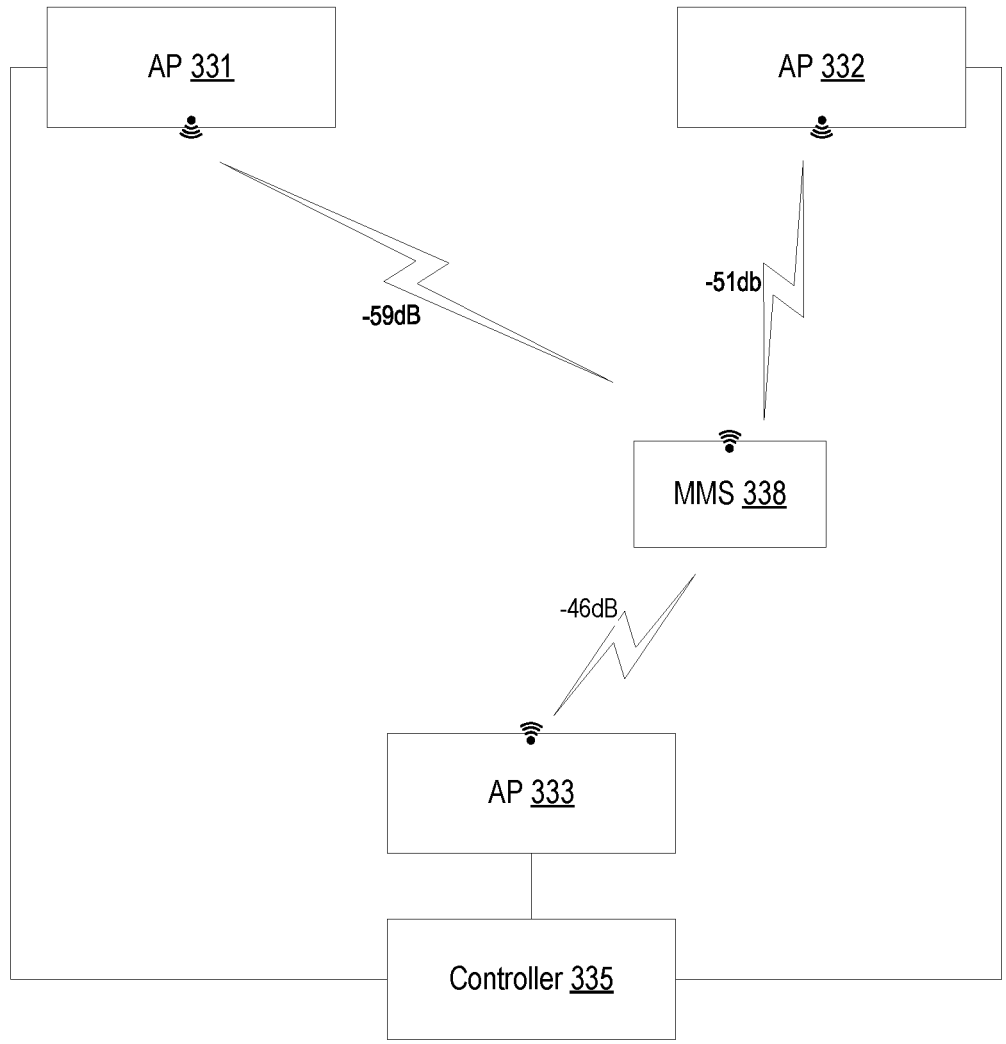
FIG. 4B illustrates a block diagram of another example system for lifetime battery tracking using a wireless interface in accordance with the present disclosure.

For further explanation, FIG. 4A sets forth a block diagram of a system (330) for lifetime battery tracking using a wireless interface according to embodiments of the present disclosure. The system (330) includes at least one MMS (338) in a production line. In some embodiments, while in the production line, the MMS (338) is assembled in a battery pack (e.g., the battery pack (102) of FIG. 1) and connected to a battery management system (e.g., the battery management system (110) of FIG. 1). The system (330) further includes a plurality of access points (APs) (331, 332, 333) at various locations in a production line. The system (330) further includes a controller (335) for analyzing the information collected by each AP (331, 332, 333). These APs continuously broadcast out a respective AP identifier (ID) on different wireless frequency channels. Each MMS (338) in the production line operates in a standby mode in which the MMS periodically wakes up to receive AP IDs from different APs and record 3-4 IDs with the strongest receive signal strength indicator (RSSI). At each wake up, the MMS (338) only scans information on a few (e.g., 1-2) frequency channels until a predetermined number of channels are covered. The same process is repeated until it is configured to join a battery management network, for example, during battery pack assembly. When the MMS (338) is moved to a different location as shown in FIG. 4B (where like numerals are used to identify like components from FIG. 4A), it will cause some change to either the RSSI values of the recorded APs or an update of the AP IDs. Once the MMS (338) detects these changes, the MMS broadcasts a unique MMS ID on a plurality of radio channels that have a high signal strength (indicated by the RSSI) and are clean from interference. The APs (331, 332, 333) will then forward the received MMS ID together with the RSSI value to a central server (e.g., controller (335)). Through this information, the system (330) may precisely locate the MMS (and associated battery module) inside a factory using location estimation algorithms including triangulation and trilateration. Additional statistical processing can be performed on the RSSI to enhance the accuracy of the location estimation, and may include analysis of maximum, minimum, average (mean), mode, and standard deviation of the signal strength. RF traffic control may be used to avoid conflicts on either AP or MMS transmission. Using such methods, accuracy could reasonably be estimated within 0.5 m<x<2 m. Once the MMS is configured to join a battery management system network, the MMS switches to operation mode and is no longer available for location tracking as this function is moved to battery pack level management. Location tracking can then be performed in a similar manner using wireless data sent from the WNC (e.g., the WNC (114) of FIG. 1) instead of the MMS, as the WNC may also wirelessly interface with APs outside the pack. It will be appreciated that an optimal placement of the APs will ensure that the quantity and the location of the APs are sufficient to provide the desired level of location estimation accuracy. Accordingly, the system (330) improves location tracking of battery pack components (e.g., the MMS and/or WNC) as they move though production and assembly in a vehicle using the wireless interfaces of the battery pack components, while conserving battery power supplied to the MMS/WNC through operation in a standby/wake-up mode. Notably, the location estimation for tracking a battery module or the entire battery pack does not have to be absolute. Embodiments in accordance with the present disclosure provide for tracking an assembled battery module or battery pack in a storeroom or warehouse, or partially assembled unit through the different stages of the production process and to be able to determine the order of components in the line.

Figure 5:
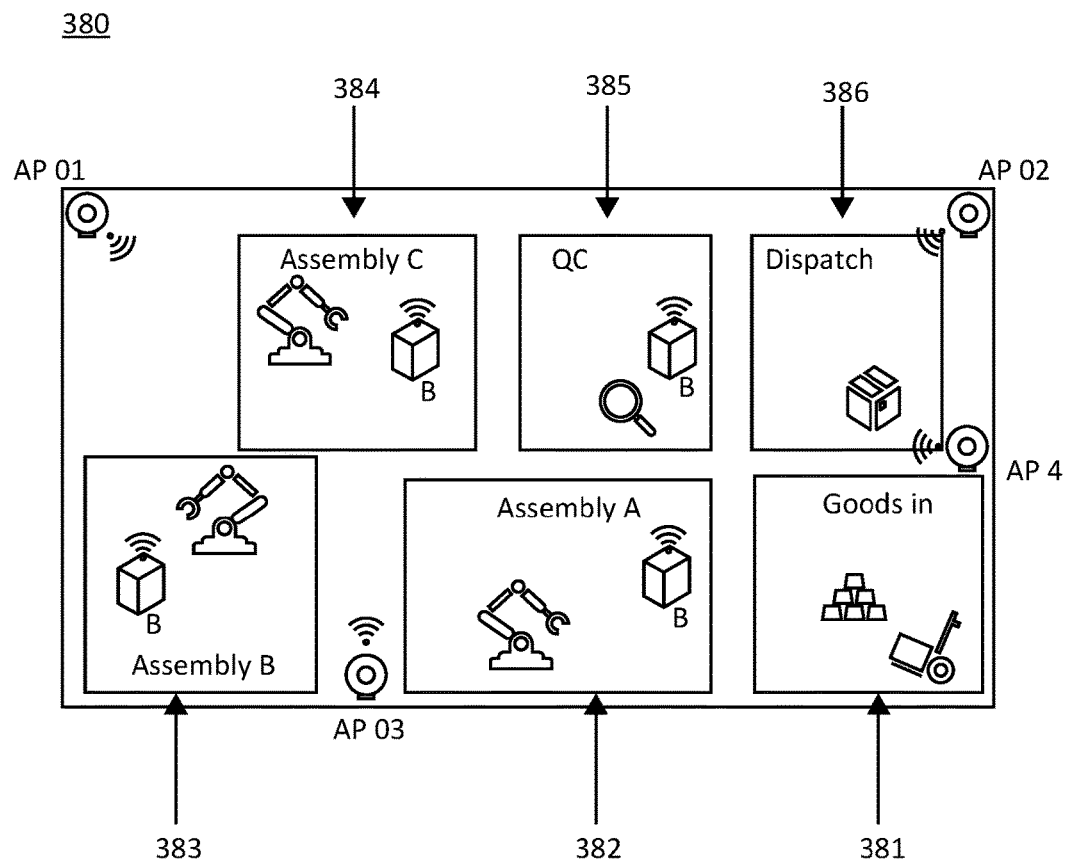
FIG. 5 illustrates a block diagram of another example system for lifetime battery tracking using a wireless interface in accordance with the present disclosure.

For further explanation, FIG. 5 shows an example factory layout (380). Unassembled parts including battery modules/cells ("B") may arrive in "goods in" stage (381), where it will not be possible to determine the location of the parts using this invention (as there will be no power to the radio). In assembly zone A (382), a CSC or MMS is connected to the battery cells and tracking can begin. The CSC or MMS will continue through various stages of assembly (e.g., assembly zone B (383) and assembly zone C (384)) and a quality control stage (385) and finally into a dispatch or assembly into a vehicle stage (386). For example, in assembly zone C (384), tracking may switch from CSC or MMS-based tracking to WNC-based tracking as described above. Thus, the location of the battery may be determined within zones rather than the absolute position, depending on the number and location of the APs (e.g., AP 01, AP 02, AP 03, AP 4). Thus, embodiments in accordance with the present disclosure provides location tracking of a battery module as it moves through a production line, even after the module has been installed in a battery pack and connected to a WNC.

Figure 6:
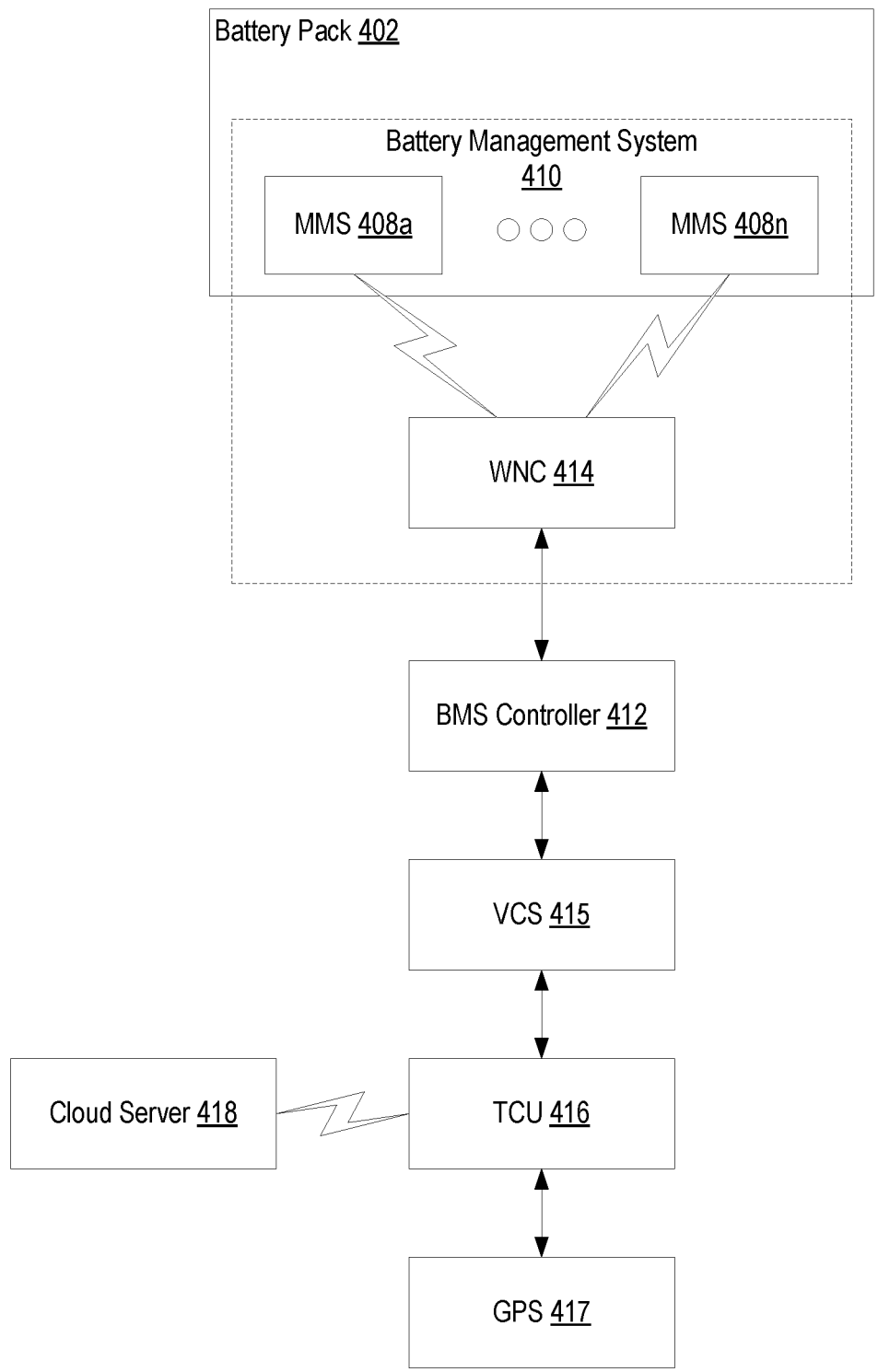
FIG. 6 illustrates a block diagram of another example system for lifetime battery tracking using a wireless interface in accordance with the present disclosure.

For further explanation, FIG. 6 sets forth a block diagram of a system (400) for lifetime battery tracking using a wireless interface according to embodiments of the present disclosure. The system (400) includes a battery management system (410) for a battery pack (402), the battery management system (410) including a plurality of MMSs (408a-n) (e.g., the MMS (200) of FIG. 2) communicatively coupled to a WNC (414) (e.g., the WNC (300) of FIG. 3) through a bidirectional wireless communication link. The WNC (414) receives battery sensor data from the MMSs (408a-n) and formats the data for communication to a BMS controller (412). For example, the WNC (414) may format the data according to a communication protocol of, for example, a CAN bus or an SPI bus. The WNC (414) may also format the data for communication via a UART. The battery management system (410) continuously sends battery module information, including battery sensor and usage data, to the vehicle control system (VCS) (415) (e.g., the VCS (112) of FIG. 1) via, for example, a CAN bus coupling the BMS controller (412) to the VCS (415). The VCS (415) is also coupled, via the CAN bus, to a telematics control unit (TCU) (416) (e.g., the TCU (500) of FIG. 7). The TCU (416) is configured to receive data from a GPS unit (417).

The battery usage data from the BMS controller (412) is associated with other vehicle information such as GPS location, speed (e.g., from vehicle sensors), and the like. In one embodiment, the battery usage data and associated vehicle and location information are transmitted to a cloud server (418) via the TCU (416). Accordingly, the system (400) provides location tracking for battery modules as well as their status and history of usage, which can be tracked in real-time. In another embodiment, if access to the cloud server is not available, the battery usage data and associated vehicle and location information are stored and later extracted for transmission to the cloud server (418), for example, during vehicle annual service, compulsory vehicle inspection, or via the driver's mobile phone as the gateway.

Figure 7:
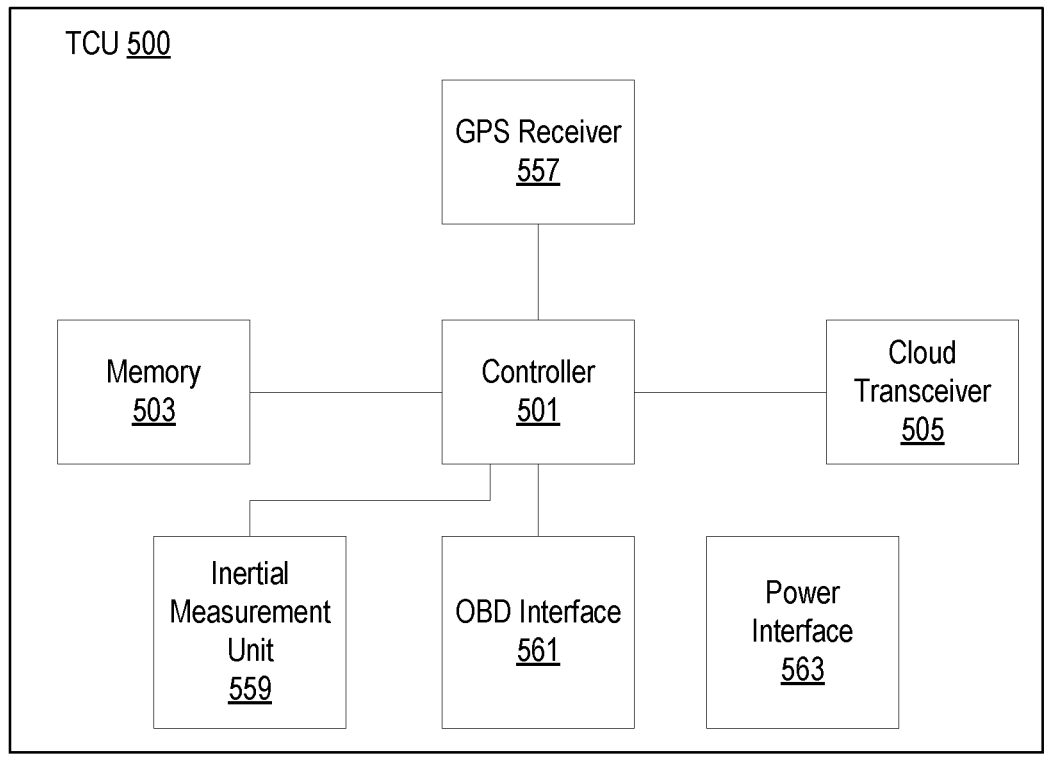
FIG. 7 illustrates a block diagram of another example system for lifetime battery tracking using a wireless interface in accordance with the present disclosure.

For further explanation, FIG. 7 sets forth a diagram of an embodiment of a telematics control unit (TCU) (500) (e.g., a system not directly coupled to vehicle-based sensors). The TCU (500) includes a controller (501), memory (503), and cloud transceiver (505) for external communications with a data source (e.g., via cellular communication). The TCU (500) also includes a Global Positioning System (GPS) receiver (557) configured to communicate with one or more GPS satellites in order to determine a vehicle location, speed, direction of movement, etc. The TCU (500) also includes an inertial measurement unit (IMU) (559) configured to measures a vehicle's specific force, angular rate, and/or orientation using a combination of accelerometers, gyroscopes, and/or magnetometers. The TCU (500) also includes an on-board diagnostics (OBD) interface (561) for coupling the TCU (500) to one or more on-board diagnostic devices of a vehicle. The TCU (500) may receive power via a power interface (563) couplable to a vehicle power bus.

In a particular embodiment, the controller (501) of the TCU (500) may be configured to collect location information from the GPS receiver (557) and to provide battery usage information and associated vehicle and location information to a cloud server or diagnostic tool.

For further explanation, FIG. 8 sets forth a flow chart illustrating an exemplary method for lifetime battery tracking using a wireless interface according to embodiments of the present disclosure that includes receiving (802), by a controller, respective first received signal strength indicator (RSSI) information from a plurality of access points (APs), the respective first RSSI information corresponding to a respective first signal received by each AP from a battery pack component, the battery pack component including at least one of a battery module monitoring system (MMS) and a wireless network controller (WNC) 802. Receiving (802), by a controller, respective first received signal strength indicator (RSSI) information from a plurality of access points (APs), the respective first RSSI information corresponding to a respective first signal received by each AP from a battery pack component, the battery pack component including at least one of a battery module monitoring system (MMS) and a wireless network controller (WNC) may be carried out by the APs (331, 332, 333) each detecting a signal from the MMS (338) and determining an RSSI for the signal received. The APs may also receive an MMS identifier in the signal. Each AP (331, 332, 333) transmits the RSSI information to the controller (335).

The method of FIG. 8 further includes determining (804), by the controller in dependence upon the respective first RSSI information, a first location of the battery pack component. Determining (804), by the controller in dependence upon the respective first RSSI information, a first location of the battery pack component may be carried out by the controller (338) using the RSSI information for the signal received by each AP, the location of the AP, and location estimation algorithms including triangulation and trilateration to determine the location of the MMS (338).

The method of FIG. 8 further includes receiving (806), by the controller, respective second RSSI information from the plurality of APs, the respective second RSSI information corresponding to a respective second signal received by each AP from the battery pack component. Receiving (806), by the controller, respective second RSSI information from the plurality of APs, the respective second RSSI information corresponding to a respective second signal received by each AP from the battery pack component may be carried out by the APs (331, 332, 333) each detecting a new signal from the MMS (338) and determining an RSSI for the new signal received. The APs may also receive the MMS identifier in the signal. Each AP (331, 332, 333) transmits the RSSI information for the new signal to the controller (335).

The method of FIG. 8 further includes determining (808), by the controller in dependence upon the respective second RSSI information, a second location of the battery pack component. Determining (808), by the controller in dependence upon the respective second RSSI information, a second location of the battery pack component may be carried out by the controller (338) using the updated RSSI information for the new signal received by each AP, the location of the AP, and location estimation algorithms including triangulation and trilateration to determine the updated location of the MMS (338).

Figure 9:
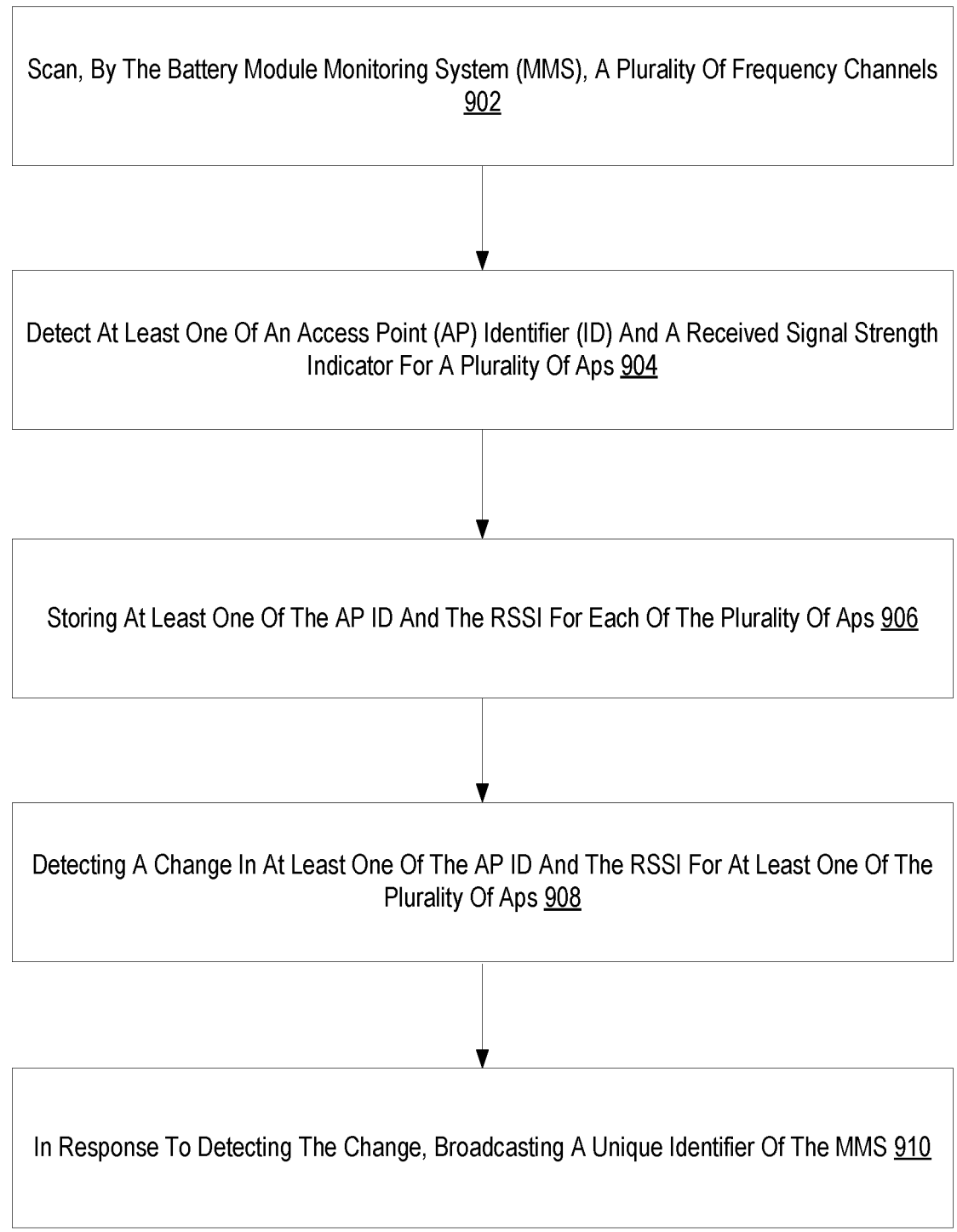
FIG. 9 is a flowchart to illustrate an implementation of a method for lifetime battery tracking using a wireless interface in accordance with the present disclosure.

For further explanation, FIG. 9 sets forth a flow chart illustrating an exemplary method for lifetime battery tracking using a wireless interface according to embodiments of the present disclosure that includes scanning (902), by the battery module monitoring system (MMS), a plurality of frequency channels. Scanning (902), by the battery module monitoring system (MMS), a plurality of frequency channels may be carried out by the MMS (338) scanning a predetermined number of channels in the 2.4 GHz frequency band.

The method of FIG. 9 further includes detecting (904) at least one of an access point (AP) identifier (ID) and a received signal strength indicator for a plurality of APs. Detecting (904) at least one of an access point (AP) identifier (ID) and a received signal strength indicator for a plurality of APs may be carried out by the MMS (338) detecting an AP ID and/or an RSSI value corresponding to a signal transmitted by each AP (331, 332, 333).

The method of FIG. 9 further includes storing (906) at least one of the AP ID and the RSSI for the plurality of APs. Storing (906) at least one of the AP ID and the RSSI for the plurality of APs may be carried out by the MMS (338) storing the AP ID and/or RSSI value corresponding to each AP (331, 332, 333) in a memory.

The method of FIG. 9 further includes detecting (908) a change in at least one of the AP ID and the RSSI for the plurality of APs. Detecting (908) a change in at least one of the AP ID and the RSSI for the plurality of APs may be carried out by the MMS (338) detecting that the signal strength associated with one or more of the APs (331, 332, 333) has changed.

The method of FIG. 9 further includes in response to detecting the change, broadcasting (910) a unique identifier of the MMS. Broadcasting (910) a unique identifier of the MMS in response to detecting the change may be carried out by the MMS (338) broadcasting a unique identifier. In this manner, when the MMS detects that is has moved based on the RSSI values of the surrounding APs, the MMS broadcasts the MMS identifier from its new position so that the APs may identify the new location and associate it with the MMS.

Figure 10:
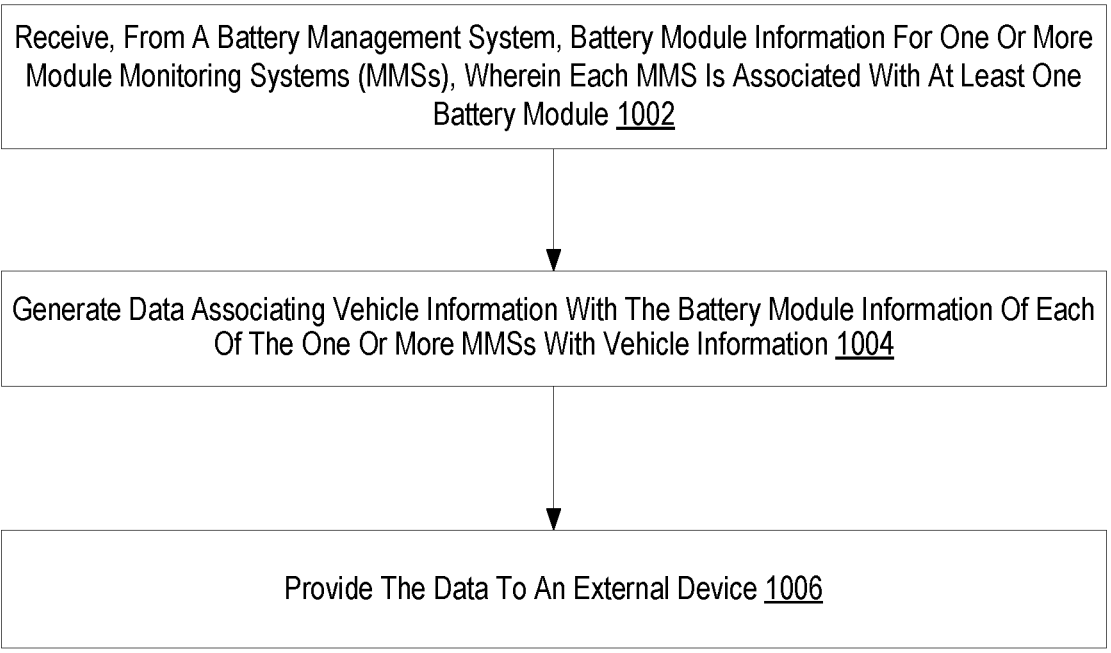
FIG. 10 is a flowchart to illustrate another implementation of a method for lifetime battery tracking using a wireless interface in accordance with the present disclosure.

For further explanation, FIG. 10 sets forth a flow chart illustrating an exemplary method for lifetime battery tracking using a wireless interface according to embodiments of the present disclosure that includes receiving (1002), from a battery management system, battery module information for one or more module monitoring systems (MMSs), wherein each MMS is associated with at least one battery module. Receiving (1002), from a battery management system, battery module information for one or more module monitoring systems (MMSs), wherein each MMS is associated with at least one battery module may be carried out by the VCS (415) receiving battery module information from the battery management system (410), the battery module information being transmitted to the WNC (414) from the battery MMSs (408a-n). The battery module information may indicate battery usage.

The method of FIG. 10 further includes generating (1004) data associating vehicle information with the battery module information of each of the one or more MMSs with vehicle information. Generating (1004) data associating vehicle information with the battery module information of each of the one or more MMSs with vehicle information may be carried out by the VCS (415) generating data associating vehicle information from other vehicle sensors with the battery module information. For example, the VCS (415) may generating data that associates a particular battery usage measurement with the current location and speed of the vehicle.

The method of FIG. 10 further includes providing (1006) the data to an external device. Providing (1006) the data to an external device may be carried out by the VCS (415) transmitting, via the TCU (416), the data associating battery usage to other vehicle information to a cloud server (418).

Providing (1006) the data to an external device may also be carried out by the VCS (415) storing the data and providing the data to a diagnostic tool or application at a later time. In this manner, historical battery usage data and operating conditions may be preserved for analysis.

Figure 11:
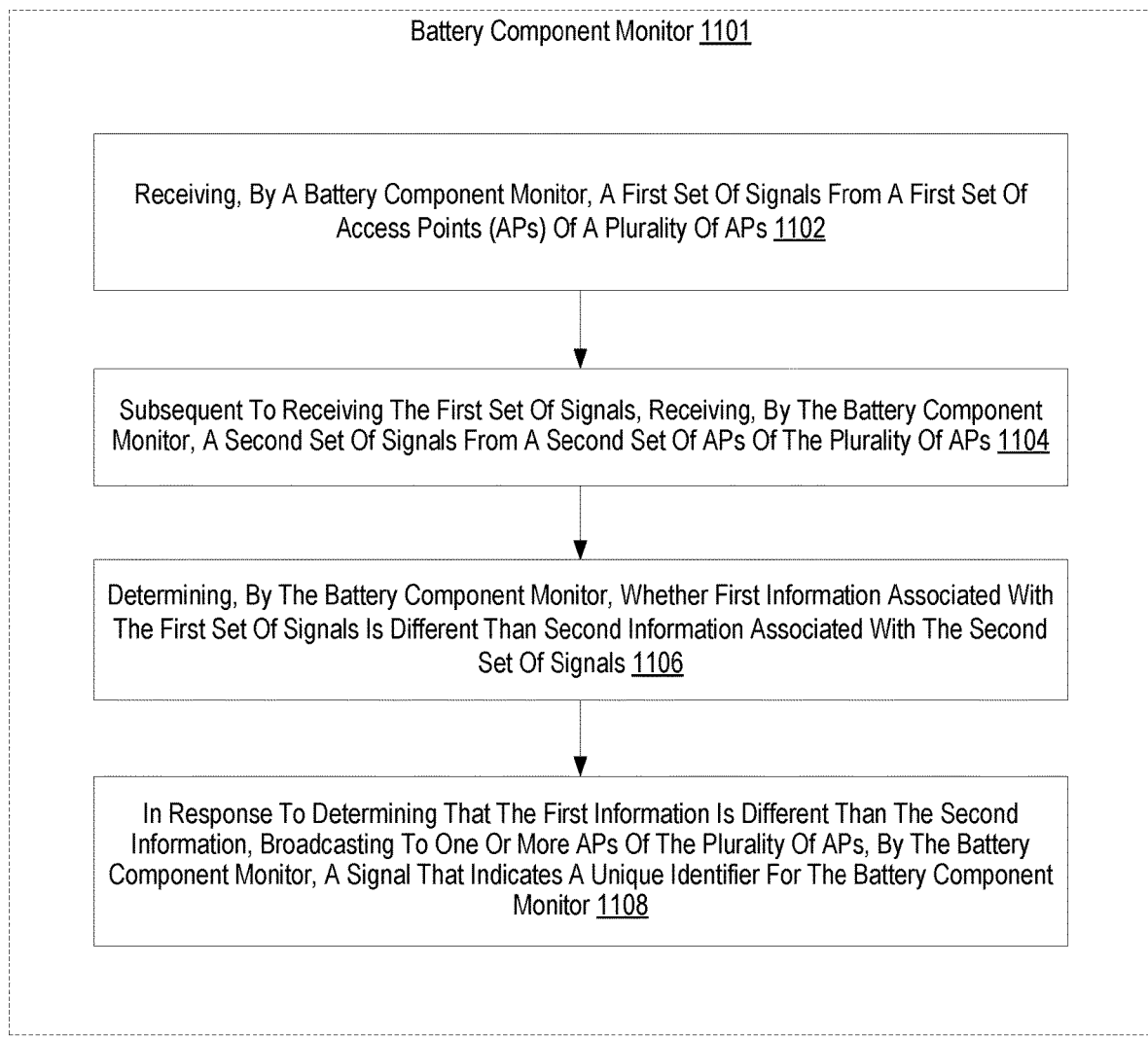
FIG. 11 is a flowchart to illustrate another implementation of a method for lifetime battery tracking using a wireless interface in accordance with the present disclosure.

For further explanation, FIG. 11 sets forth a flowchart to illustrate another implementation of a method for lifetime battery tracking using a wireless interface in accordance with the present disclosure. The method of FIG. 11 includes receiving (1102), by a battery component monitor (1101), a first set of signals from a first set of access points (APs) of a plurality of APs. A battery component monitor may be a cell monitoring unit (CMU) (e.g., the module (106) of FIG. 1); a module monitoring system (MMS) (e.g., the MMS (108) of FIG. 1); a wireless network controller (WNC) (e.g., the WNC (114) of FIG. 1); and a battery management system (BMS) (e.g., the BMS (110) of FIG. 1). An access point (AP) may be a device that transmits and receives wireless signals. In a particular embodiment, a plurality of APs may be distributed within a battery pack assembly line. Receiving (1102), by a battery component monitor (1101), a first set of signals from a first set of access points (APs) of a plurality of APs may be carried out by turning on a wireless receiver of the battery component monitor for a predetermined amount of time or after a predetermined number of frequencies are scanned; scanning a plurality of frequencies; receiving signals on one or more frequencies; turning-off the wireless receiver; and storing information about the signals in a memory or storage device connected to the battery component monitor.

The method of FIG. 11 also includes subsequent to receiving the first set of signals, receiving (1104), by the battery component monitor (1101), a second set of signals from a second set of APs of the plurality of APs. In a particular embodiment, the membership of the first set of APs matches the membership of the second set of APs. In other embodiments, the membership of the first set of APs does not match the membership of the second set of APs. Receiving (1104), by the battery component monitor (1101), a second set of signals from a second set of APs of the plurality of APs subsequent to receiving the first set of signals may be carried out by turning on a wireless receiver of the battery component monitor for a predetermined amount of time or after a predetermined number of frequencies are scanned; scanning a plurality of frequencies; receiving signals on one or more frequencies; turning-off the wireless receiver; and storing information about the signals in a memory or storage device connected to the battery component monitor.

In addition, the method of FIG. 11 includes determining (1106), by the battery component monitor (1101), whether first information associated with the first set of signals is different than second information associated with the second set of signals. In a particular embodiment, the first information may indicate for each AP of the first set of APs, a strength of the received signal from the AP relative to the received signals of the other APs of the first set of APs. In this embodiment, the second information may indicate for each AP of the second set of APs, a strength of the received signal from the AP relative to the received signals of the other APs of the second set of APs. In another embodiment, the first information indicates for each AP of the first set of APs, a strength of the received signal from the AP and the second information indicates for each AP of the second set of APs, a strength of the received signal from the AP. In yet another embodiment, the first information indicates for each received signal of the first set of received signals, a strength of the received signal relative to the other received signals of the first set of received signals and the second information indicates for each received signal of the second set of received signals, a strength of the received signal relative to the other received signals of the second set of received signals. Determining (1106), by the battery component monitor (1101), whether first information associated with the first set of signals is different than second information associated with the second set of signals may be carried out by comparing data of the first information to data of the second information. For example, the first information may include a list of the APs that each have one of the strongest three or four received signals of the first set of received signals and the second information may include a list of the APs that each have one of the strongest three or four received signals of the second set of received signals. Continuing with this example, the battery component monitor may determine that the list of APs in the second information has different APs than the list in the first information. In this example, this change in the APs that are listed in the second information may indicate that the battery component monitor is closer to one or more APs and is farther away from one or more APs.

The method of FIG. 11 also includes in response to determining that the first information is different than the second information, broadcasting (1108) to one or more APs of the plurality of APs, by the battery component monitor (1101), a signal that indicates a unique identifier for the battery component monitor. Broadcasting (1108), in response to determining that the first information is different than the second information, to one or more APs of the plurality of APs, by the battery component monitor (1101), a signal that indicates a unique identifier for the battery component monitor may be carried out by turning-on a wireless transmitter or transceiver; and transmitting a signal that includes information identifying the battery component monitor. As will be explained below in FIG. 16, an AP may receive this broadcast signal from the battery component monitor and may use the receipt of the signal as an indication that the battery component monitor has determined that the location of the battery component monitor has changed. The AP may then relay that information to a tracking controller. As will be explained below in FIG. 18, the tracking controller may receive this signal from the AP, as well as other APs, and using the information provided by the APs, determine a location of the battery component monitor.

Figure 12:
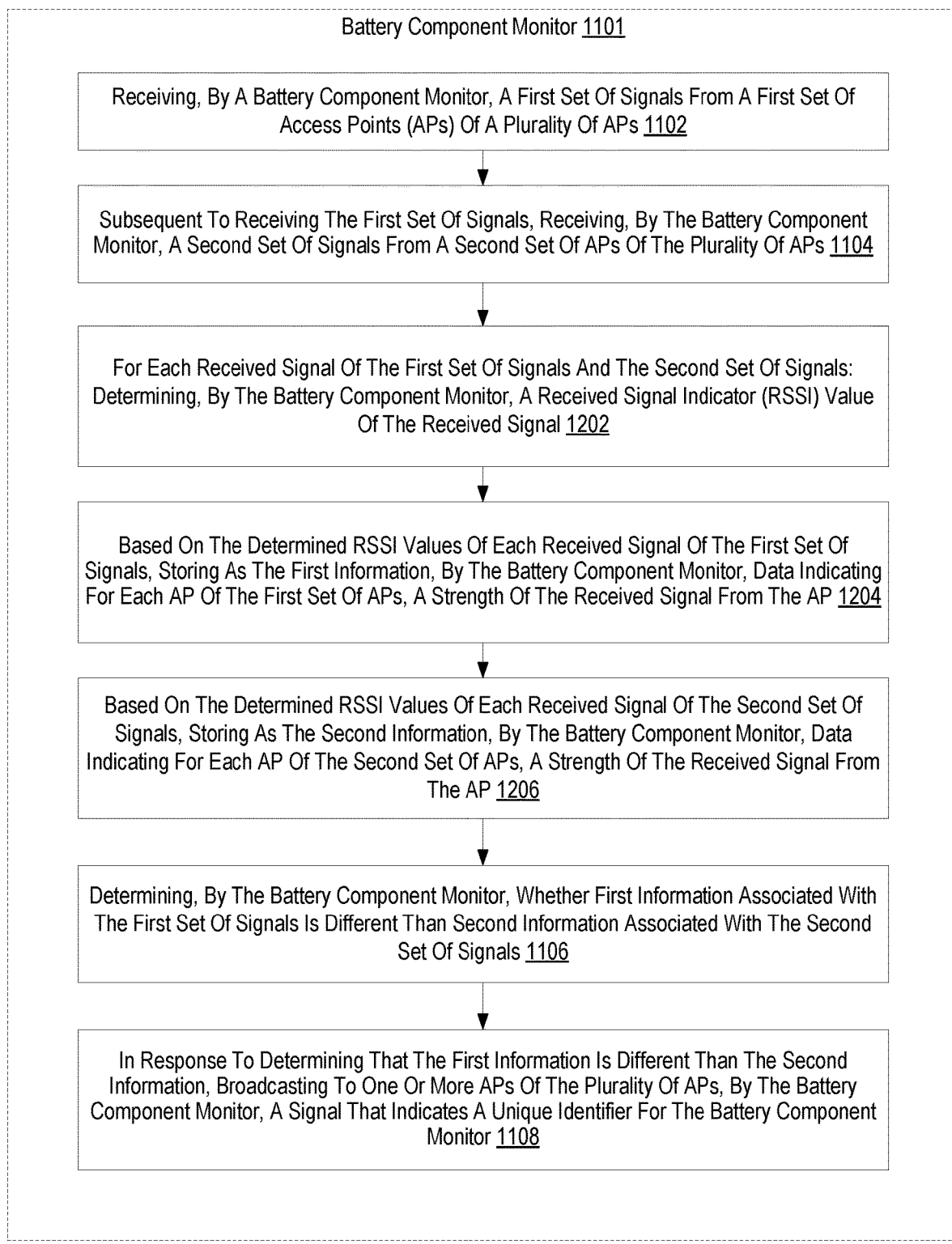
FIG. 12 is a flowchart to illustrate an implementation of a method for lifetime battery tracking using a wireless interface in accordance with the present disclosure.

For further explanation, FIG. 12 sets forth a flowchart to illustrate an implementation of a method for lifetime battery tracking using a wireless interface in accordance with the present disclosure. The method of FIG. 12 is similar to the method of FIG. 11 in that the method of FIG. 12 also includes receiving (1102), by a battery component monitor (1101), a first set of signals from a first set of access points (APs) of a plurality of APs; subsequent to receiving the first set of signals, receiving (1104), by the battery component monitor (1101), a second set of signals from a second set of APs of the plurality of APs; determining (1106), by the battery component monitor (1101), whether first information associated with the first set of signals is different than second information associated with the second set of signals; and in response to determining that the first information is different than the second information, broadcasting (1108) to one or more APs of the plurality of APs, by the battery component monitor (1101), a signal that indicates a unique identifier for the battery component monitor.

However, the method of FIG. 12 also includes for each received signal of the first set of signals and the second set of signals: determining (1202), by the battery component monitor (1101), a received signal indicator (RSSI) value of the received signal. Determining (1202), for each received signal of the first set of signals and the second set of signals, by the battery component monitor (1101), a received signal indicator (RSSI) value of the received signal may be carried out by measuring an estimate of the power level that a receiver of the battery component monitor is receiving from a particular AP. Assuming that each AP is broadcasting its wireless signal with the same transmission strength, the farther away a particular AP is from the battery component monitor, the weaker the RSSI value of the received signal from the particular AP. Conversely, the closer the particular AP is to the battery component monitor, the stronger the RSSI value of the received signal from the particular AP.

In addition, the method of FIG. 12 includes based on the determined RSSI values of each received signal of the first set of signals, storing (1204) as the first information, by the battery component monitor (1101), data indicating for each AP of the first set of APs, a strength of the received signal from the AP. Storing (1204) as the first information, based on the determined RSSI values of each received signal of the first set of signals, by the battery component monitor (1101), data indicating for each AP of the first set of APs, a strength of the received signal from the AP may be carried out by storing for each AP, an indication of the strength of the AP's signal relative to the other APs. For example, the first information may include a list of the APs where the APs are sorted based on signal strength. As another example, the first information may include a list of APs where the APs each have an associated number that corresponds to the RSSI value, so that the value indicates the strength of the AP's signal relative to the other APs.

The method of FIG. 12 also includes based on the determined RSSI values of each received signal of the second set of signals, storing (1206) as the second information, by the battery component monitor (1101), data indicating for each AP of the second set of APs, a strength of the received signal from the AP. Storing (1206), based on the determined RSSI values of each received signal of the second set of signals, as the second information, by the battery component monitor (1101), data indicating for each AP of the second set of APs, a strength of the received signal from the AP may be carried out by storing for each AP, an indication of the strength of the AP's signal relative to the other APs. For example, the first information may include a list of the APs where the APs are sorted based on signal strength. As another example, the first information may include a list of APs where the APs each have an associated number that corresponds to the RSSI value, so that the value indicates the strength of the AP's signal relative to the other APs.

Figure 13:
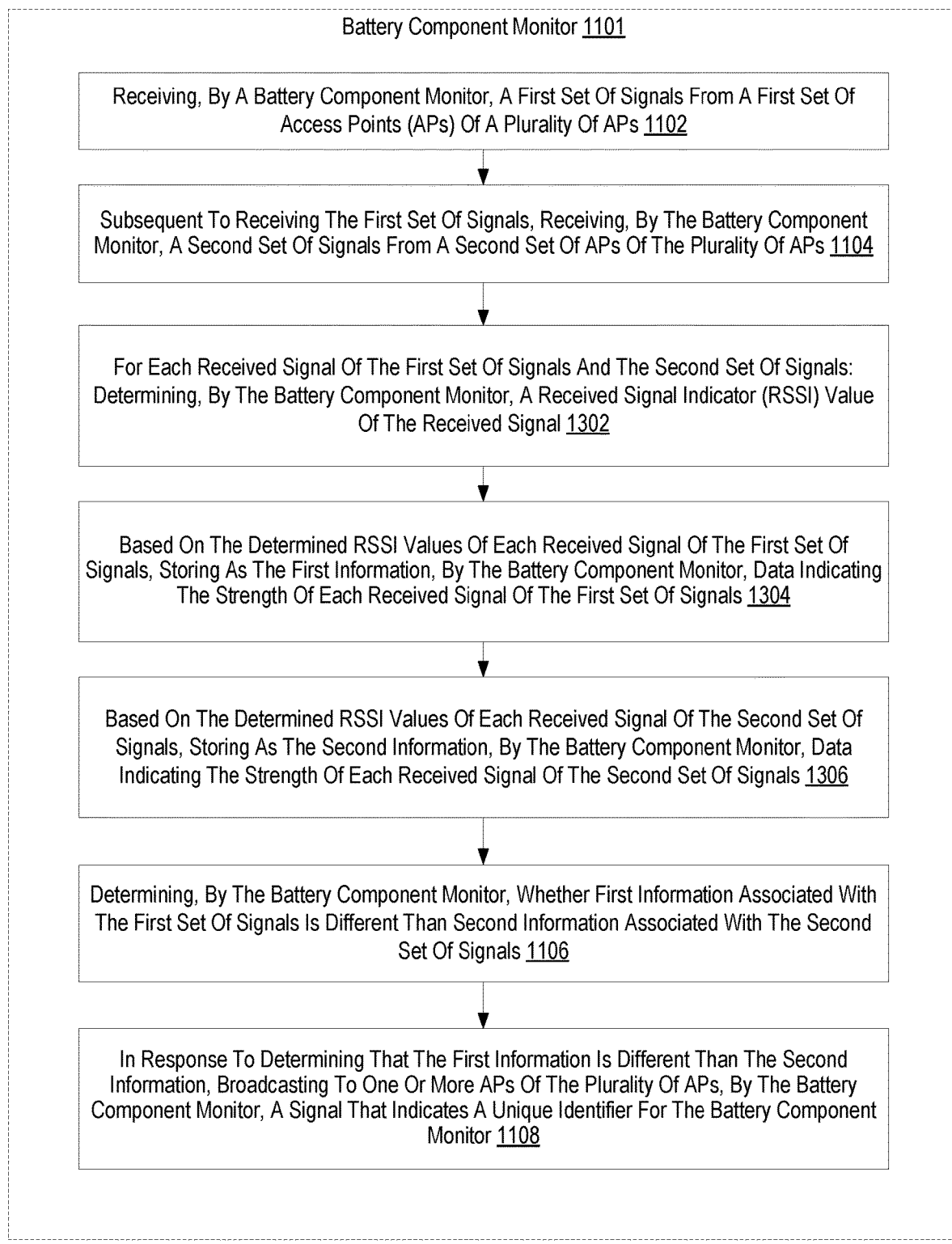
FIG. 13 is a flowchart to illustrate another implementation of a method for lifetime battery tracking using a wireless interface in accordance with the present disclosure.

For further explanation, FIG. 13 sets forth a flowchart to illustrate another implementation of a method for lifetime battery tracking using a wireless interface in accordance with the present disclosure. The method of FIG. 13 is similar to the method of FIG. 11 in that the method of FIG. 13 also includes receiving (1102), by a battery component monitor (1101), a first set of signals from a first set of access points (APs) of a plurality of APs; subsequent to receiving the first set of signals, receiving (1104), by the battery component monitor (1101), a second set of signals from a second set of APs of the plurality of APs; determining (1106), by the battery component monitor (1101), whether first information associated with the first set of signals is different than second information associated with the second set of signals; and in response to determining that the first information is different than the second information, broadcasting (1108) to one or more APs of the plurality of APs, by the battery component monitor (1101), a signal that indicates a unique identifier for the battery component monitor.

However, the method of FIG. 13 also includes for each received signal of the first set of signals and the second set of signals: determining (1302), by the battery component monitor (1101), a received signal indicator (RSSI) value of the received signal. Determining (1302), for each received signal of the first set of signals and the second set of signals, by the battery component monitor (1101), a received signal indicator (RSSI) value of the received signal may be carried out by measuring an estimate of the power level that a receiver of the battery component monitor is receiving from a particular AP. Assuming that each AP is broadcasting its wireless signal with the same transmission strength, the farther away a particular AP is from the battery component monitor, the weaker the RSSI value of the received signal from the particular AP. Conversely, the closer the particular AP is to the battery component monitor, the stronger the RSSI value of the received signal from the particular AP.

The method of FIG. 13 also includes based on the determined RSSI values of each received signal of the first set of signals, storing (1304) as the first information, by the battery component monitor (1101), data indicating the strength of each received signal of the first set of signals. Storing (1304) as the first information, based on the determined RSSI values of each received signal of the first set of signals, by the battery component monitor (1101), data indicating the strength of each received signal of the first set of signals may be carried out by storing for each signal, an indication of the strength of the signal relative to the other signals. For example, the first information may include a list of the signals where the signals are identified and sorted based on signal strength. As another example, the first information may include a list of signals where the signals each have an associated number that corresponds to the RSSI value, so that the value indicates the strength of the signals relative to the other signals.

In addition, the method of FIG. 13 includes based on the determined RSSI values of each received signal of the second set of signals, storing (1306) as the second information, by the battery component monitor (1101), data indicating the strength of each received signal of the second set of signals. Storing (1306) as the second information, based on the determined RSSI values of each received signal of the second set of signals, by the battery component monitor (1101), data indicating the strength of each received signal of the second set of signals may be carried out by storing for each signal, an indication of the strength of the signal relative to the other signals. For example, the first information may include a list of the signals where the signals are identified and sorted based on signal strength. As another example, the first information may include a list of signals where the signals each have an associated number that corresponds to the RSSI value, so that the value indicates the strength of the signals relative to the other signals.

Figure 14:
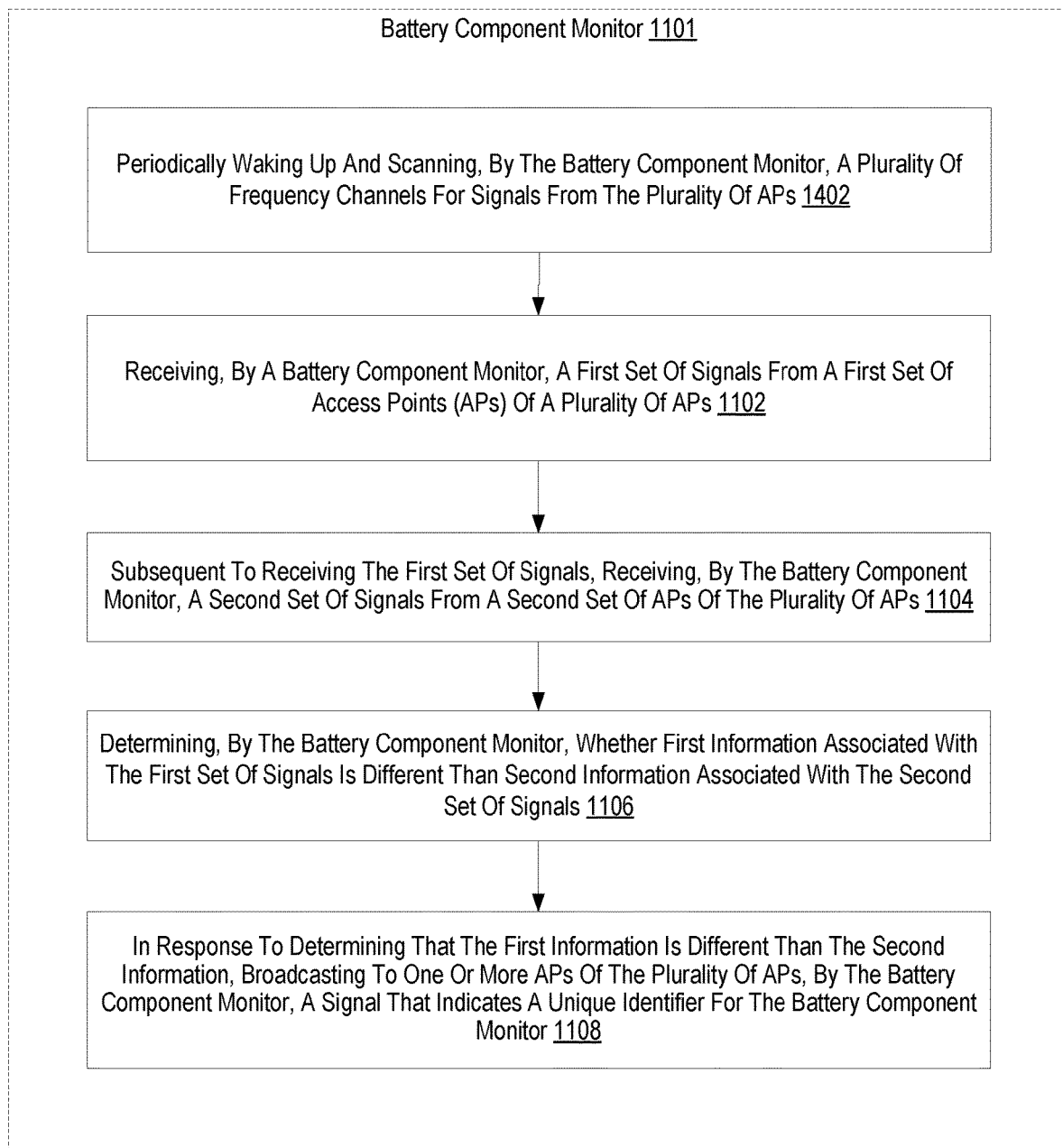
FIG. 14 is a flowchart to illustrate another implementation of a method for lifetime battery tracking using a wireless interface in accordance with the present disclosure.

For further explanation, FIG. 14 sets forth a flowchart to illustrate another implementation of a method for lifetime battery tracking using a wireless interface in accordance with the present disclosure. The method of FIG. 14 is similar to the method of FIG. 11 in that the method of FIG. 14 also includes receiving (1102), by a battery component monitor (1101), a first set of signals from a first set of access points (APs) of a plurality of APs; subsequent to receiving the first set of signals, receiving (1104), by the battery component monitor (1101), a second set of signals from a second set of APs of the plurality of APs; determining (1106), by the battery component monitor (1101), whether first information associated with the first set of signals is different than second information associated with the second set of signals; and in response to determining that the first information is different than the second information, broadcasting (1108) to one or more APs of the plurality of APs, by the battery component monitor (1101), a signal that indicates a unique identifier for the battery component monitor.

The method of FIG. 14 includes periodically waking up and scanning (1402), by the battery component monitor (1101), a plurality of frequency channels for signals from the plurality of APs. Periodically waking up and scanning (1402), by the battery component monitor (1101), a plurality of frequency channels for signals from the plurality of APs may be carried out by turning-on a wireless transceiver or receiver of the battery component monitor for a predetermined amount of time or after a predetermined number of frequencies are scanned.

Figure 15:
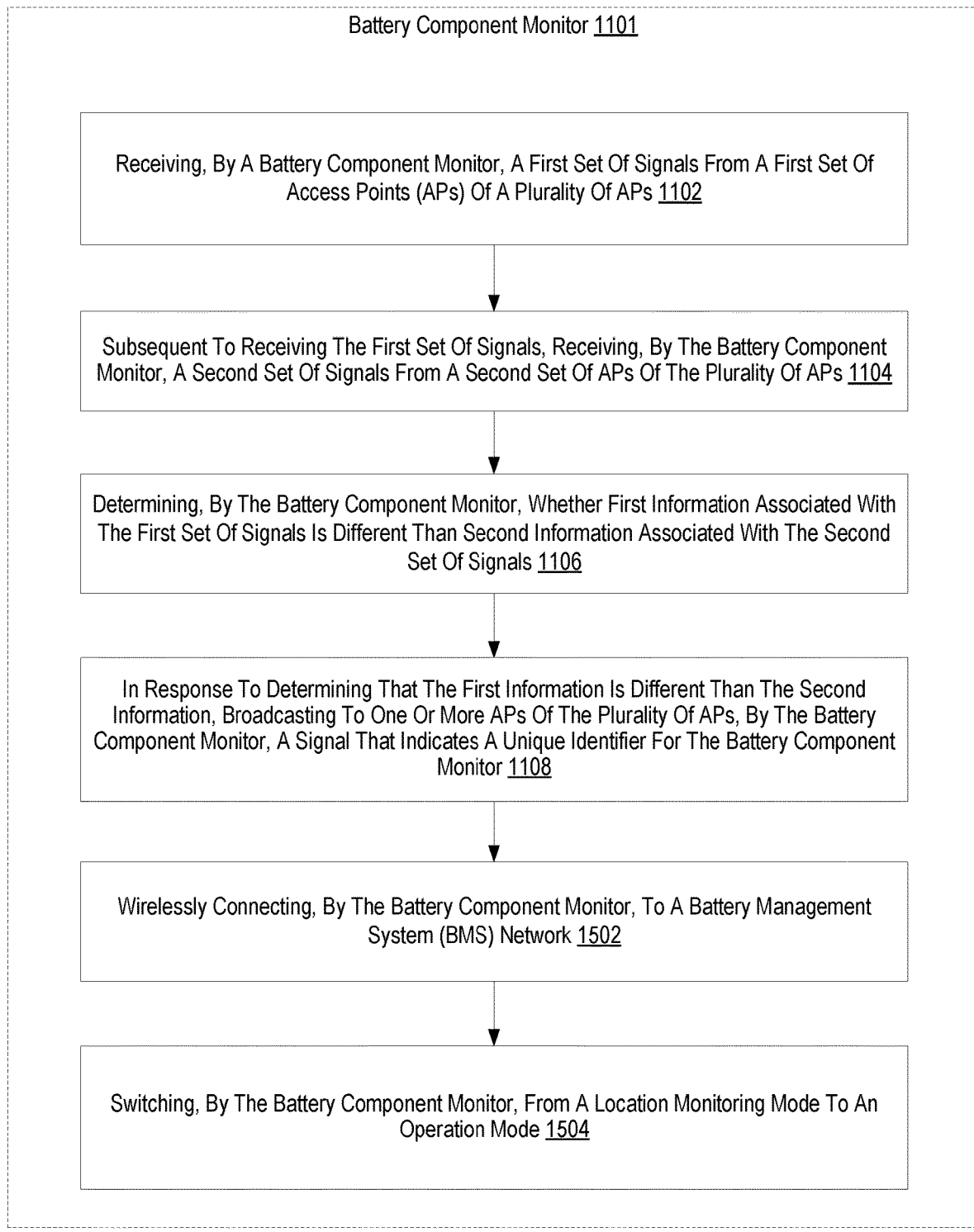
FIG. 15 is a flowchart to illustrate an implementation of a method for lifetime battery tracking using a wireless interface in accordance with the present disclosure.

For further explanation, FIG. 15 sets forth a flowchart to illustrate an implementation of a method for lifetime battery tracking using a wireless interface in accordance with the present disclosure. The method of FIG. 15 is similar to the method of FIG. 11 in that the method of FIG. 15 also includes receiving (1102), by a battery component monitor (1101), a first set of signals from a first set of access points (APs) of a plurality of APs; subsequent to receiving the first set of signals, receiving (1104), by the battery component monitor (1101), a second set of signals from a second set of APs of the plurality of APs; determining (1106), by the battery component monitor (1101), whether first information associated with the first set of signals is different than second information associated with the second set of signals; and in response to determining that the first information is different than the second information, broadcasting (1108) to one or more APs of the plurality of APs, by the battery component monitor (1101), a signal that indicates a unique identifier for the battery component monitor.

The method of FIG. 15 includes wirelessly connecting (1502), by the battery component monitor (1101), to a battery management system (BMS) network. Wirelessly connecting (1502), by the battery component monitor (1101), to a battery management system (BMS) network may be carried out by the battery component monitor being assembled in a battery pack and being coupled, via wires or wirelessly to a BMS network that includes one or more components of a BMS.

In addition, the method of FIG. 15 includes switching (1504), by the battery component monitor (1101), from a location monitoring mode to an operation mode. In a location monitoring mode, the battery component monitor may be configured to periodically wakeup, scan frequencies, record signals from APs, and transmit a unique signal when a change in location of the battery component monitor is detected. Once the battery component monitor is coupled to a BMS network, another device of the BMS network may take over the role from the battery component monitor of recording signals from APs and transmitting a signal to indicate that the location of the device has changed. Switching (1504), by the battery component monitor (1101), from a location monitoring mode to an operation mode may be carried out by detecting that the battery component monitor has wirelessly connected to the BMS network and in response to detecting that the battery component monitor has wirelessly connected to the BMS network, changing one or more mode parameters within the battery component monitor to indicate that the battery component monitor has switched to the operation mode.

Figure 16:
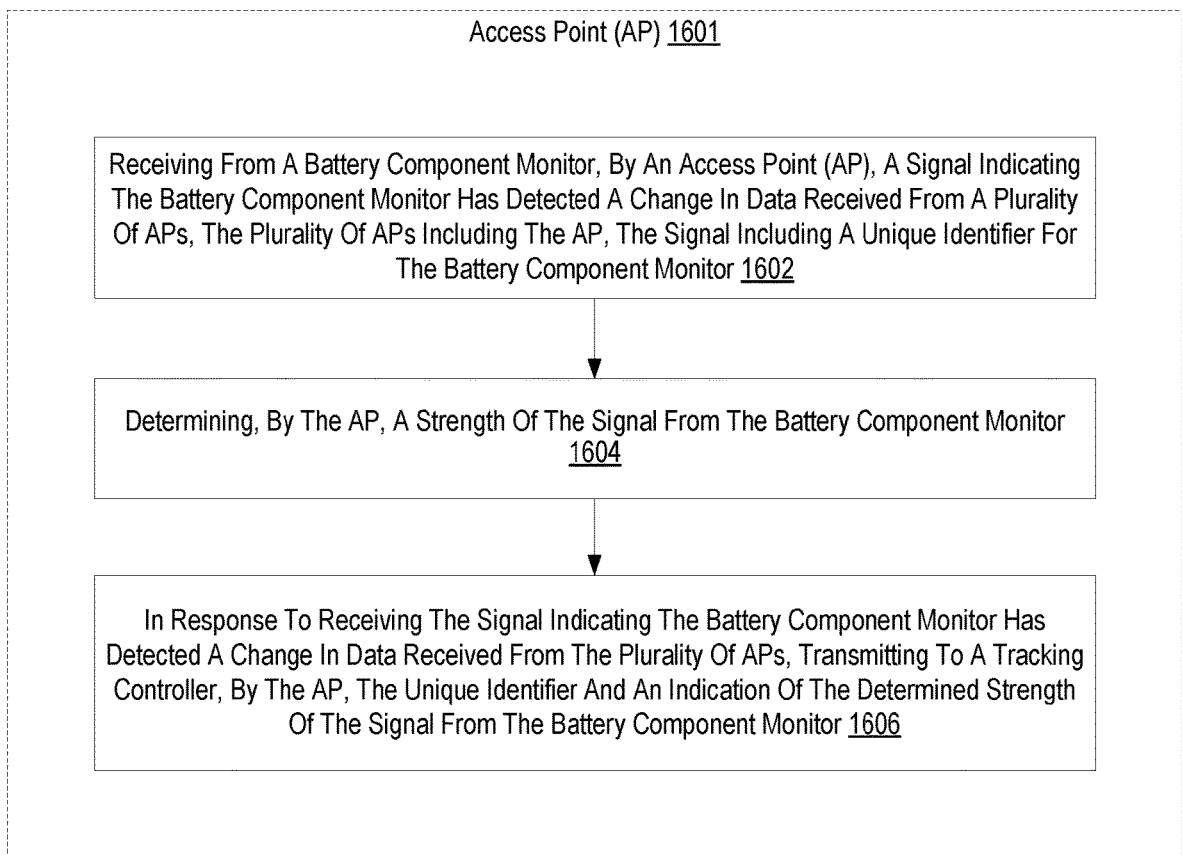
FIG. 16 is a flowchart to illustrate another implementation of a method for lifetime battery tracking using a wireless interface in accordance with the present disclosure.

For further explanation, FIG. 16 sets forth a flowchart to illustrate another implementation of a method for lifetime battery tracking using a wireless interface in accordance with the present disclosure. The method of FIG. 16 includes receiving (1602) from a battery component monitor, by an access point (1601), a signal indicating the battery component monitor has detected a change in data received from a plurality of APs, the plurality of APs including the AP, the signal including a unique identifier for the battery component monitor. As explained above in FIG. 11, a battery component monitor may broadcast a unique signal in response to detecting a change, in between sets of signals, in RSSI values of the signals from the APs. Receiving (1602) from a battery component monitor, by an access point (1601), a signal indicating the battery component monitor has detected a change in data received from a plurality of APs, the plurality of APs including the AP, the signal including a unique identifier for the battery component monitor may be carried out by receiving a signal that indicates a unique identifier for the battery component monitor.

The method of FIG. 16 also includes determining (1602), by the AP, a strength of the signal from the battery component monitor. Determining (1602), by the AP, a strength of the signal from the battery component monitor may be carried out by measuring an estimate of the power level that a receiver of the AP is receiving from the battery component monitor.

In addition, the method of FIG. 16 includes in response to receiving the signal indicating the battery component monitor has detected a change in data received from the plurality of APs, transmitting (1606) to a tracking controller, by the AP (1601), the unique identifier and an indication of the determined strength of the signal from the battery component monitor. Transmitting (1606) to a tracking controller, by the AP (1601), the unique identifier in response to receiving the signal indicating the battery component monitor has detected a change in data received from the plurality of APs may be carried out by turning-on a transmitter/transceiver and transmitting the signal.

As will be explained further in FIG. 18, a tracking controller may receive a plurality of signals from APs, each of which indicates the unique identifier for the battery component monitor and a strength (as determined by the particular AP), of the signal received by the AP from the battery component monitor. The tracking controller may then use the determined strengths to determine, with location estimation algorithms (e.g., triangulation and trilateration), the location of the battery component monitor.

Figure 17:
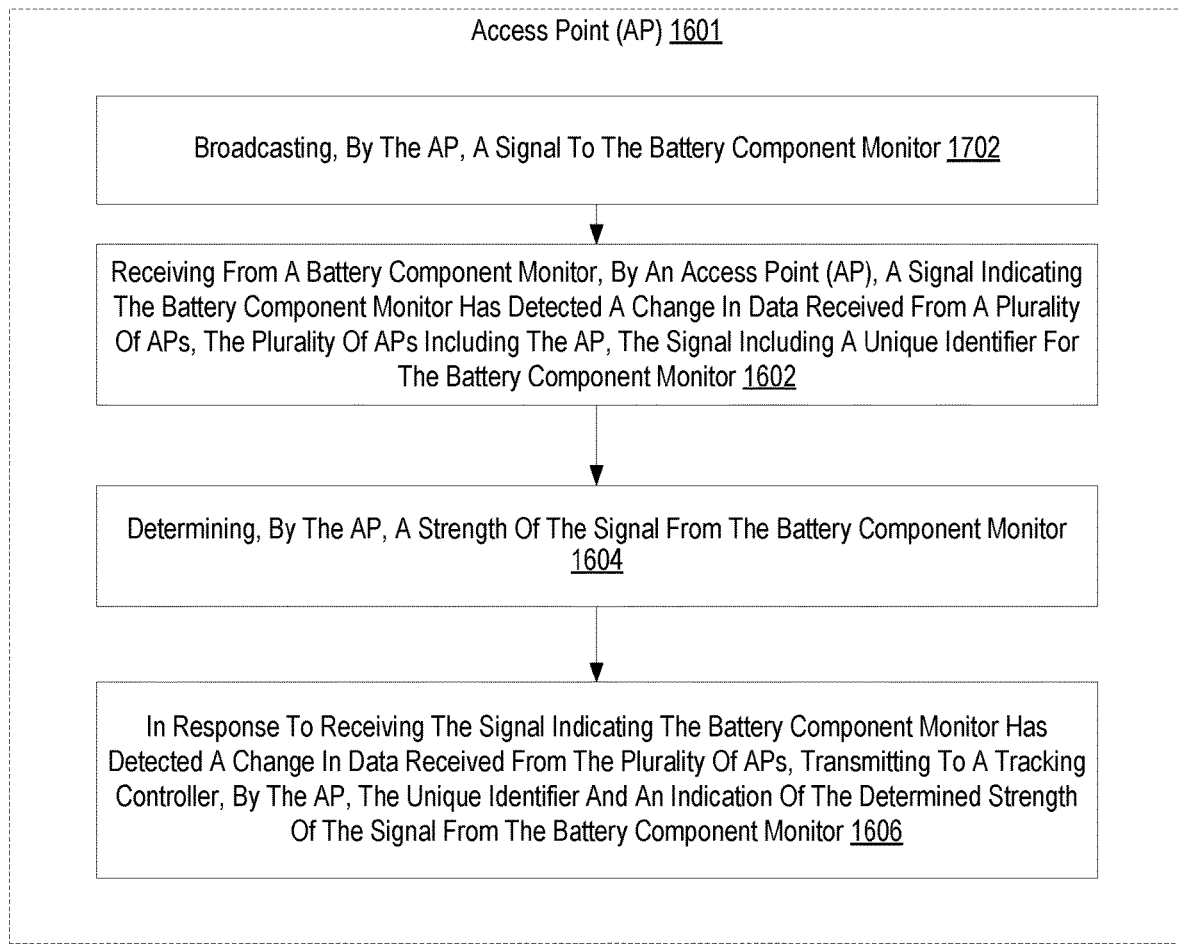
FIG. 17 is a flowchart to illustrate another implementation of a method for lifetime battery tracking using a wireless interface in accordance with the present disclosure.

For further explanation, FIG. 17 sets forth a flowchart to illustrate another implementation of a method for lifetime battery tracking using a wireless interface in accordance with the present disclosure. The method of FIG. 17 is similar to the method of FIG. 16 in that the method of FIG. 17 also includes receiving (1602) from a battery component monitor, by an access point (1601), a signal indicating the battery component monitor has detected a change in data received from a plurality of APs, the plurality of APs including the AP, the signal including a unique identifier for the battery component monitor; and in response to receiving the signal indicating the battery component monitor has detected a change in data received from the plurality of APs, transmitting (1604) to a tracking controller, by the AP (1601), the unique identifier.

However, the method of FIG. 17 includes broadcasting (1702), by the AP (1601), a signal to the battery component monitor. Broadcasting (1702), by the AP (1601), a signal to the battery component monitor may be carried out by transmitting a signal that includes a unique identifier for the AP. As explained in FIG. 11, the battery component monitor may use the signals from APs to determine whether the battery component monitor has changed location.

Figure 18:
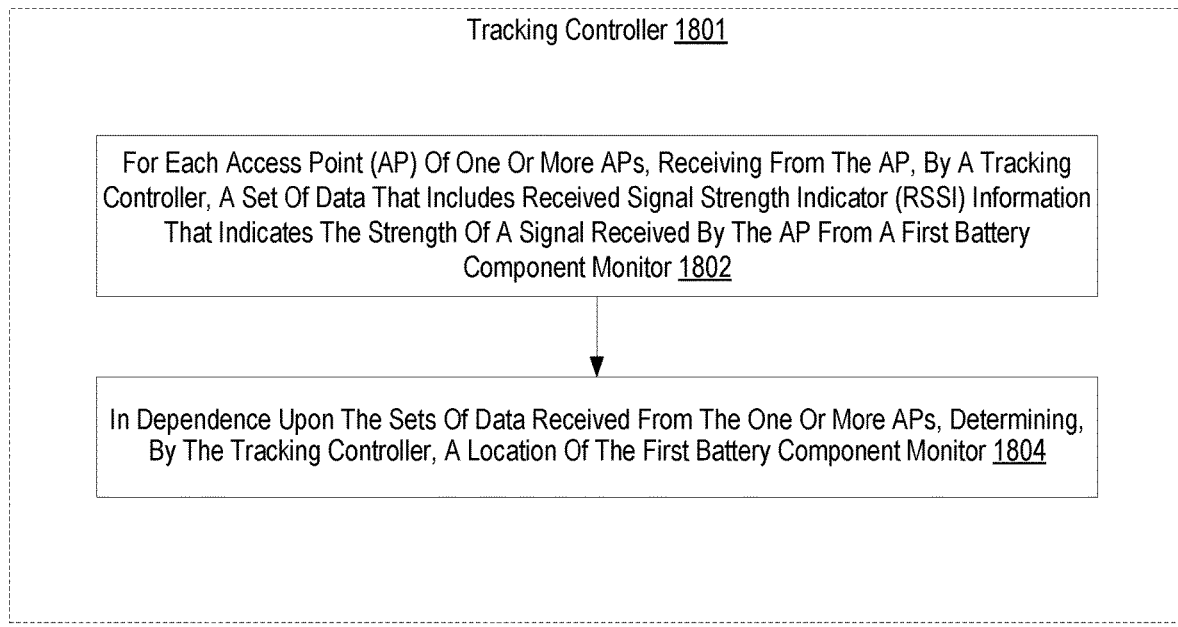
FIG. 18 is a flowchart to illustrate an implementation of a method for lifetime battery tracking using a wireless interface in accordance with the present disclosure.

For further explanation, FIG. 18 sets forth a flowchart to illustrate an implementation of a method for lifetime battery tracking using a wireless interface in accordance with the present disclosure. The method of FIG. 18 includes for each access point (AP) of one or more APs, receiving (1802) from the AP, by a tracking controller (1801), a set of data that includes received signal strength indicator (RSSI) information that indicates the strength of a signal received by the AP from a first battery component monitor. Receiving (1802) from the AP, by a tracking controller (1801), for each access point (AP) of one or more APs, a set of data that includes received signal strength indicator (RSSI) information that indicates the strength of a signal received by the AP from a first battery component monitor may be carried receiving an indication of the RSSI information.

As explained in FIG. 16, in response to receiving an indication that a battery component monitor has changed location, an AP may transmit a signal to a tracking controller with an identifier of the battery component monitor and an indication of the strength of the signal received by the AP from the battery component monitor. In a particular embodiment, a plurality of APs may receive the indication that the battery component monitor has changed location and each may broadcast a signal to a tracking controller with an indication of the strength of the signal received by the particular AP from the battery component monitor.

In addition, the method of FIG. 18 includes in dependence upon the sets of data received from the one or more APs, determining (1804), by the tracking controller (1802), a location of the first battery component monitor. Determining (1804), by the tracking controller (1802), a location of the first battery component monitor in dependence upon the sets of data received from the one or more APs may be carried out by for each AP, determining the distance of the battery component monitor to the AP; and using triangulation and/or trilateration to determine the location of the battery component monitor.

Figure 19:
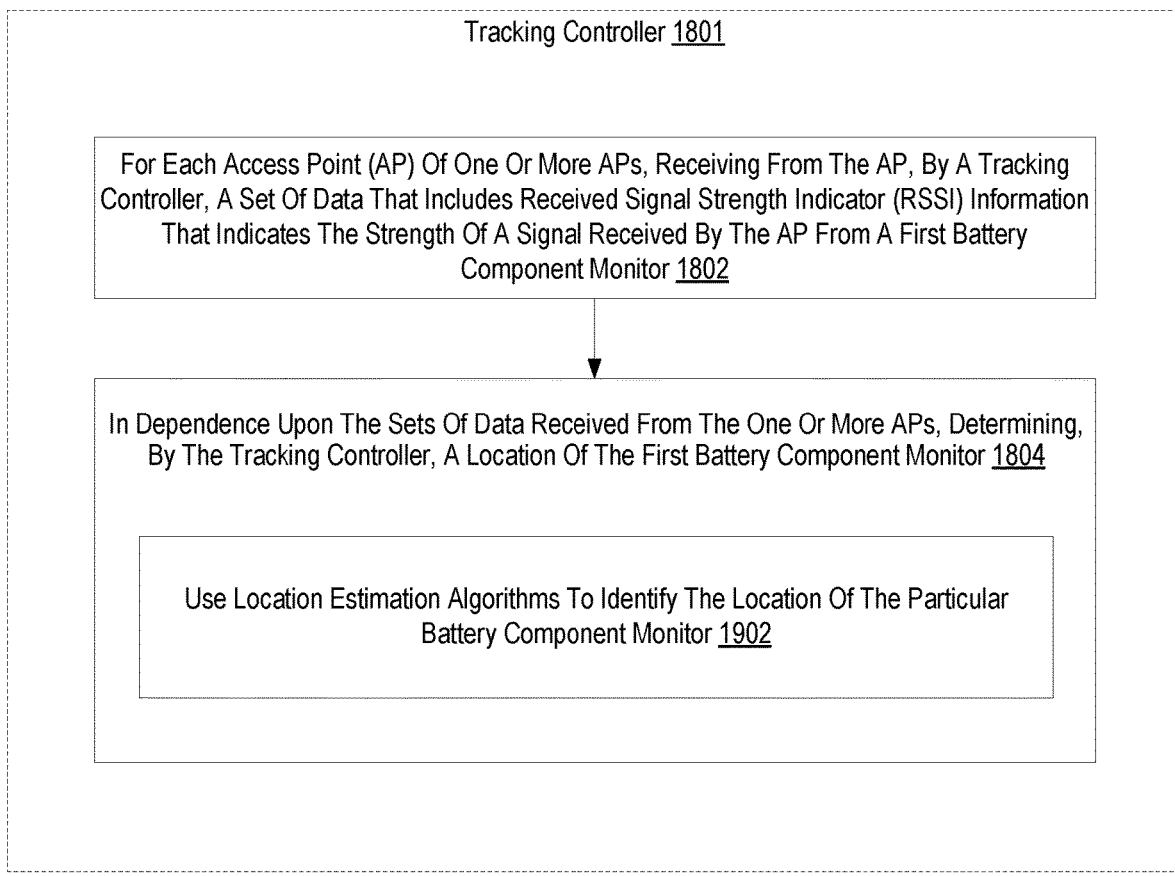
FIG. 19 is a flowchart to illustrate another implementation of a method for lifetime battery tracking using a wireless interface in accordance with the present disclosure.

For further explanation, FIG. 19 sets forth a flowchart to illustrate another implementation of a method for lifetime battery tracking using a wireless interface in accordance with the present disclosure. The method of FIG. 19 is similar to the method of FIG. 18 in that the method of FIG. 19 also includes for each access point (AP) of one or more APs, receiving (1802) from the AP, by a tracking controller (1801), a set of data that includes received signal strength indicator (RSSI) information that indicates the strength of a signal received by the AP from a first battery component monitor; and in dependence upon the sets of data received from the one or more APs, determining (1804), by the tracking controller (1802), a location of the first battery component monitor.

In the method of FIG. 19, determining (1804) in dependence upon each set of data received from the one or more APs, by the tracking controller (1801), a location of the particular battery component monitor includes using (1902) location estimation algorithms to identify the location of the particular battery component monitor. Using (1902) location estimation algorithms to identify the location of the particular battery component monitor may be carried out by using triangulation and/or trilateration to determine the location of the battery component monitor.

Figure 20:
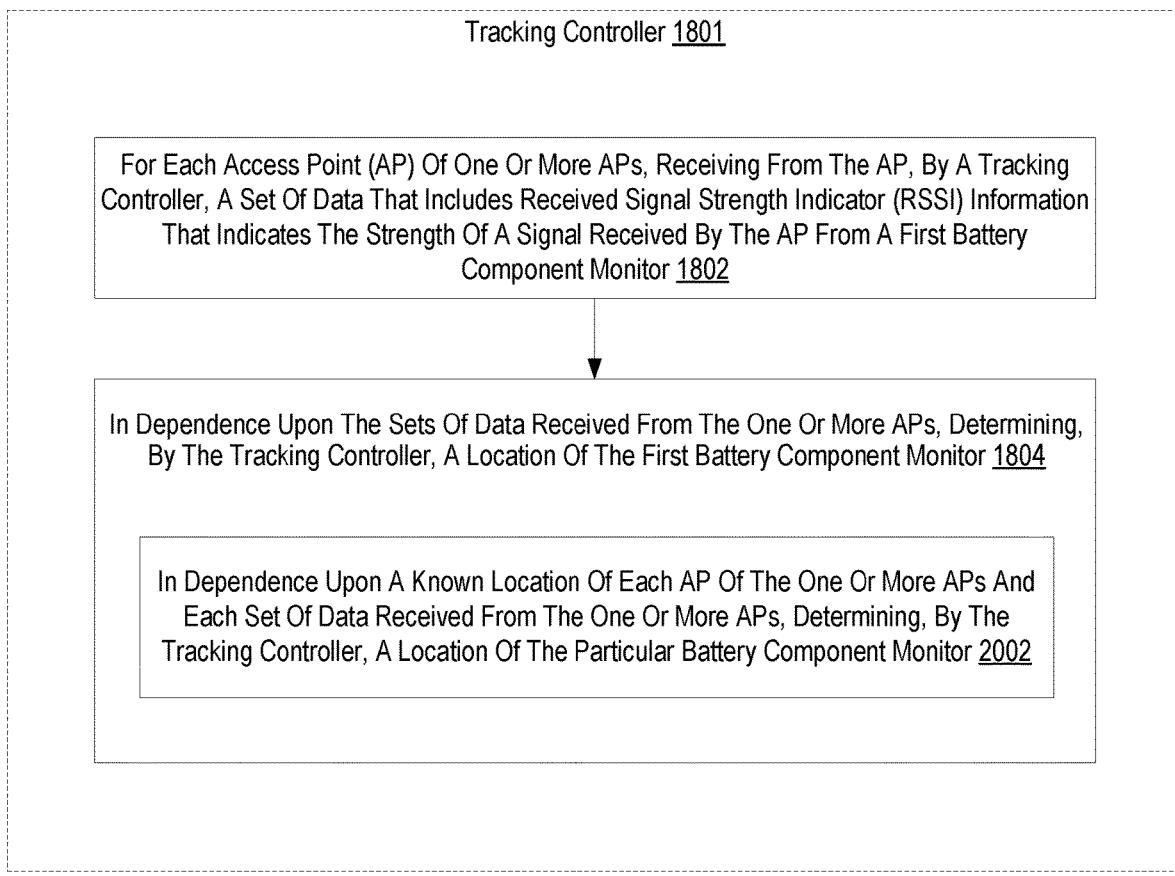
FIG. 20 is a flowchart to illustrate an implementation of a method for lifetime battery tracking using a wireless interface in accordance with the present disclosure.

For further explanation, FIG. 20 sets forth a flowchart to illustrate an implementation of a method for lifetime battery tracking using a wireless interface in accordance with the present disclosure. The method of FIG. 20 is similar to the method of FIG. 18 in that the method of FIG. 20 also includes for each access point (AP) of one or more APs, receiving (1802) from the AP, by a tracking controller (1801), a set of data that includes received signal strength indicator (RSSI) information that indicates the strength of a signal received by the AP from a first battery component monitor; and in dependence upon the sets of data received from the one or more APs, determining (1804), by the tracking controller (1802), a location of the first battery component monitor.

In the method of FIG. 20, determining (1804) in dependence upon each set of data received from the one or more APs, by the tracking controller (1801), a location of the particular battery component monitor includes in dependence upon a known location of each AP of the one or more APs and each set of data received from the one or more APs, determining (2002), by the tracking controller (1801), a location of the particular battery component monitor. Determining (2002), by the tracking controller (1801), a location of the particular battery component monitor in dependence upon a known location of each AP of the one or more APs and each set of data received from the one or more APs may be carried out by incorporating predetermined location information (e.g., the location of an AP within a battery pack assembly line) for each AP in the location estimation algorithms.

Figure 21:
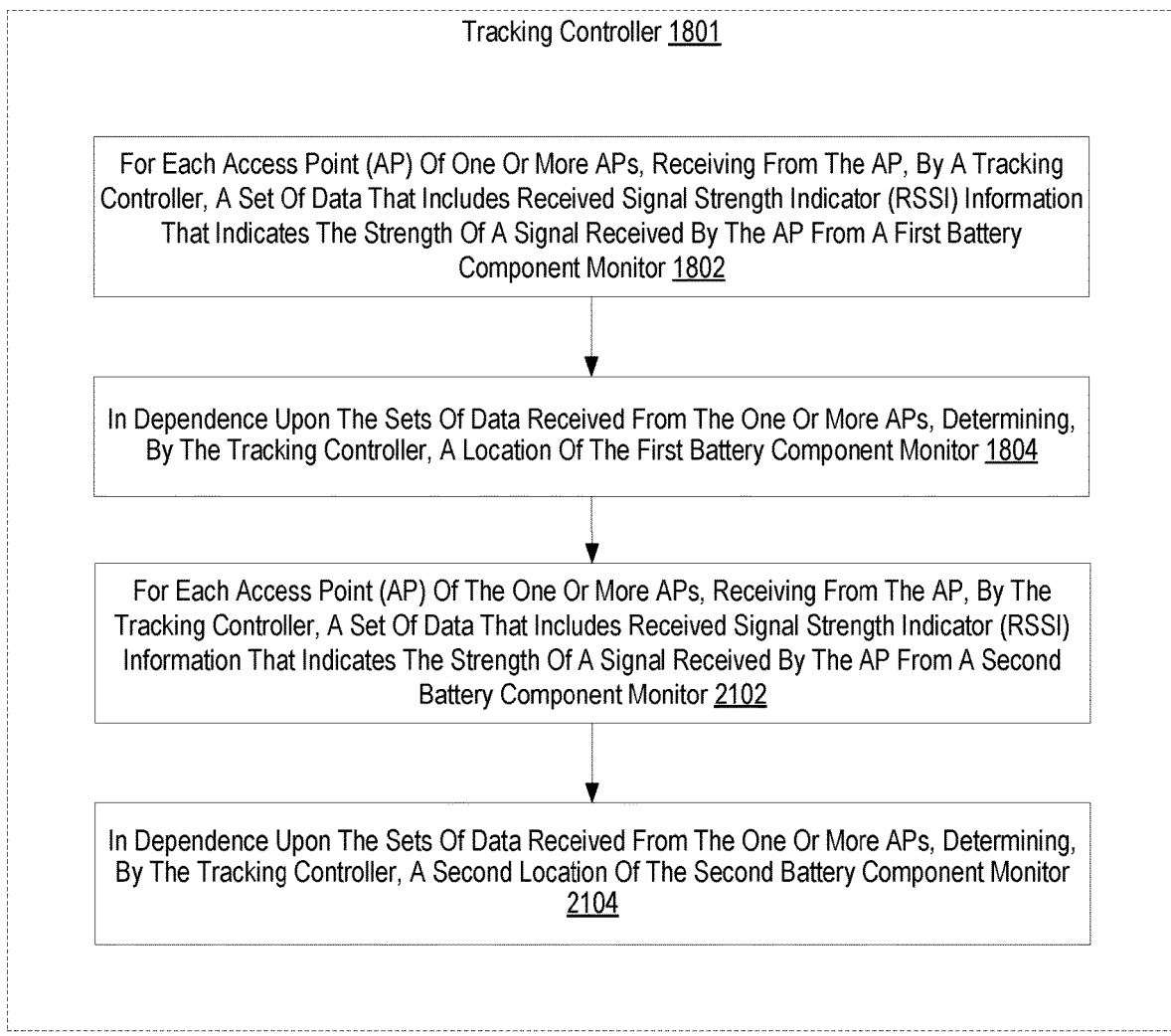
FIG. 21 is a flowchart to illustrate another implementation of a method for lifetime battery tracking using a wireless interface in accordance with the present disclosure.

For further explanation, FIG. 21 sets forth a flowchart to illustrate another implementation of a method for lifetime battery tracking using a wireless interface in accordance with the present disclosure. The method of FIG. 21 is similar to the method of FIG. 18 in that the method of FIG. 21 also includes for each access point (AP) of one or more APs, receiving (1802) from the AP, by a tracking controller (1801), a set of data that includes received signal strength indicator (RSSI) information that indicates the strength of a signal received by the AP from a first battery component monitor; and in dependence upon the sets of data received from the one or more APs, determining (1804), by the tracking controller (1802), a location of the first battery component monitor.

However, the method of FIG. 21 includes for each access point (AP) of the one or more APs, receiving (2102) from the AP, by the tracking controller (1801), a set of data that includes received signal strength indicator (RSSI) information that indicates the strength of a signal received by the AP from a second battery component monitor. Receiving (2102) from the AP, by the tracking controller (1801), for each access point (AP) of the one or more APs, a set of data that includes received signal strength indicator (RSSI) information that indicates the strength of a signal received by the AP from a second battery component monitor may be carried out by receiving an indication of the RSSI information.

In addition, the method of FIG. 21 also includes in dependence upon the sets of data received from the one or more APs, determining (2104), by the tracking controller (1801), a second location of the second battery component monitor. Determining (2104) in dependence upon the sets of data received from the one or more APs, by the tracking controller (1801), a second location of the second battery component monitor may be carried out by for each AP, determining the distance of the battery component monitor to the AP; and using triangulation and/or trilateration to determine the second location of the second battery component monitor.

Figure 22:
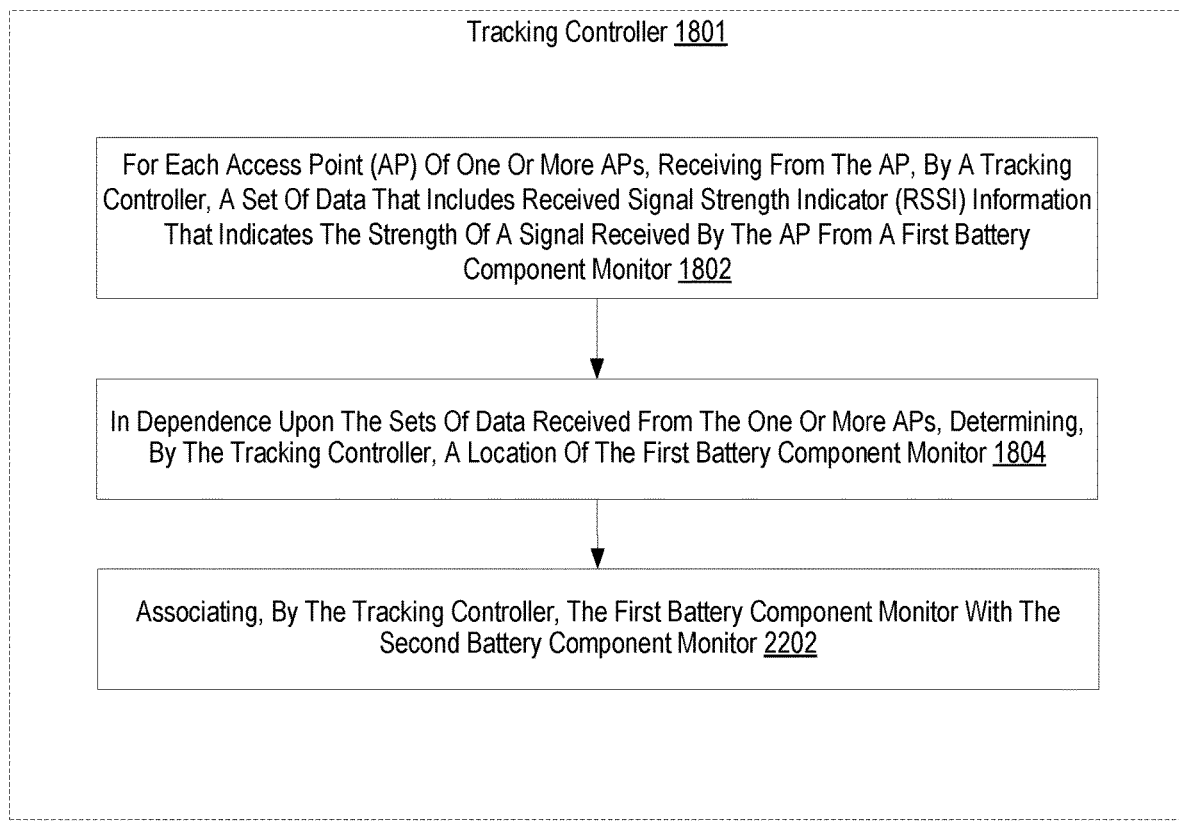
FIG. 22 is a flowchart to illustrate another implementation of a method for lifetime battery tracking using a wireless interface in accordance with the present disclosure.

For further explanation, FIG. 22 sets forth a flowchart to illustrate another implementation of a method for lifetime battery tracking using a wireless interface in accordance with the present disclosure. The method of FIG. 22 is similar to the method of FIG. 21 in that the method of FIG. 22 also includes for each access point (AP) of one or more APs, receiving (1802) from the AP, by a tracking controller (1801), a set of data that includes received signal strength indicator (RSSI) information that indicates the strength of a signal received by the AP from a first battery component monitor; in dependence upon the sets of data received from the one or more APs, determining (1804), by the tracking controller (1802), a location of the first battery component monitor; for each access point (AP) of the one or more APs, receiving (2102) from the AP, by the tracking controller (1801), a set of data that includes received signal strength indicator (RSSI) information that indicates the strength of a signal received by the AP from a second battery component monitor; and in dependence upon the sets of data received from the one or more APs, determining (2104), by the tracking controller (1801), a second location of the second battery component monitor and the first component monitor.

However, the method of FIG. 22 also includes associating (2202), by the tracking controller (1801), the first battery component monitor with the second battery component monitor. Associating (2202), by the tracking controller (1801), the first battery component monitor with the second battery component monitor may be carried out by determining that the first battery component monitor and the second battery component monitor are part of the same battery management system (BMS) network; and storing an indication that the first battery component monitor and the second battery component monitor are part of the same BMS network.

Figure 23:
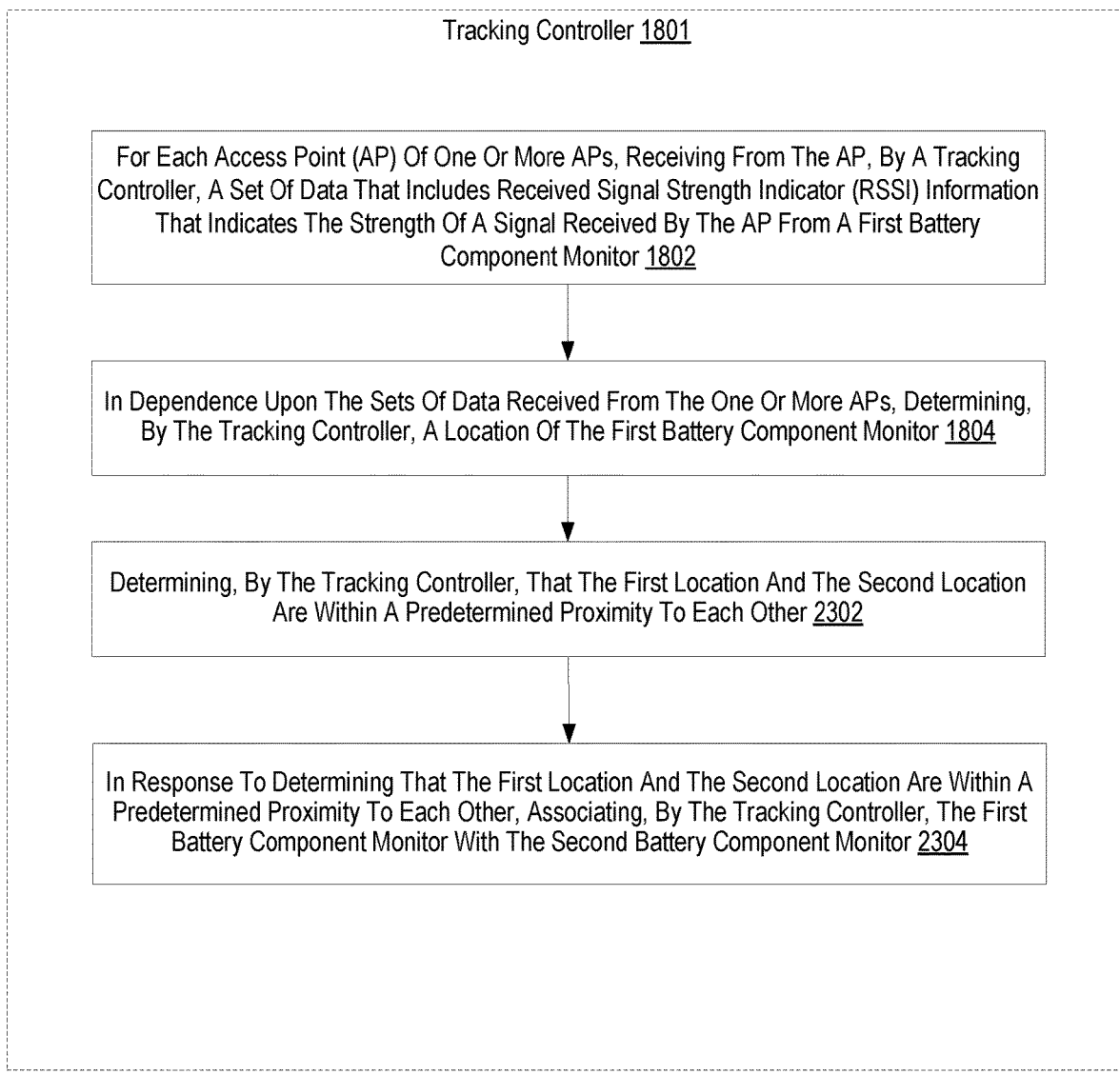
FIG. 23 is a flowchart to illustrate an implementation of a method for lifetime battery tracking using a wireless interface in accordance with the present disclosure.

For further explanation, FIG. 23 sets forth a flowchart to illustrate an implementation of a method for lifetime battery tracking using a wireless interface in accordance with the present disclosure. The method of FIG. 23 is similar to the method of FIG. 21 in that the method of FIG. 23 also includes for each access point (AP) of one or more APs, receiving (1802) from the AP, by a tracking controller (1801), a set of data that includes received signal strength indicator (RSSI) information that indicates the strength of a signal received by the AP from a first battery component monitor; in dependence upon the sets of data received from the one or more APs, determining (1804), by the tracking controller (1802), a location of the first battery component monitor; for each access point (AP) of the one or more APs, receiving (2102) from the AP, by the tracking controller (1801), a set of data that includes received signal strength indicator (RSSI) information that indicates the strength of a signal received by the AP from a second battery component monitor; and in dependence upon the sets of data received from the one or more APs, determining (2104), by the tracking controller (1801), a second location of the second battery component monitor and the first component monitor.

However, the method of FIG. 23 includes determining (2302), by the tracking controller (1801), that the first location and the second location are within a predetermined proximity to each other. Determining (2302), by the tracking controller (1801), that the first location and the second location are within a predetermined proximity to each other may be carried out by determining the distance between the first location and the second location; and comparing the determined distance to a predetermined threshold corresponding to a predetermined proximity.

In addition, the method of FIG. 23 also includes in response to determining that the first location and the second location are within a predetermined proximity to each other, associating (2304), by the tracking controller (1801), the first battery component monitor with the second battery component monitor. Associating (2304) in response to determining that the first location and the second location are within a predetermined proximity to each other, by the tracking controller (1801), the first battery component monitor with the second battery component monitor may be carried out by storing an indication that the first battery component monitor and the second battery component monitor are part of the same BMS network.

For example, a first battery component monitor may be a first MMS and a second component monitor may be a second MMS. In this example, if the first location of the first MMS and the second location of the second MMS are close to each other, the tracking controller may determine that that the first MMS and the second MMS are part of the same battery management system (BMS) network.

Figure 24:
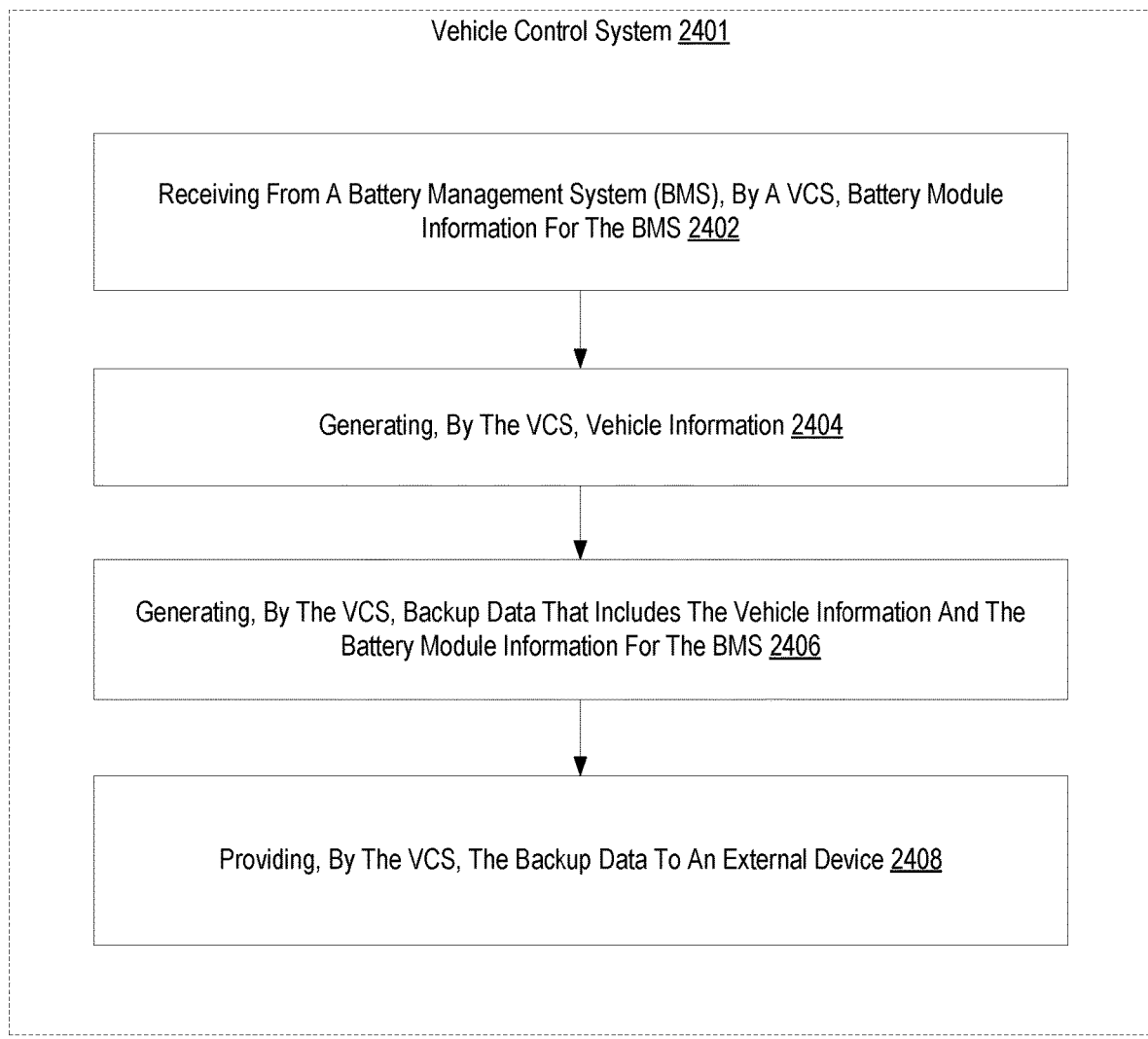
FIG. 24 is a flowchart to illustrate another implementation of a method for lifetime battery tracking using a wireless interface in accordance with the present disclosure.

For further explanation, FIG. 24 sets forth a flowchart to illustrate another implementation of a method for lifetime battery tracking using a wireless interface in accordance with the present disclosure. The method of FIG. 24 includes receiving (2402) from a battery management system (BMS), by a vehicle control system (2401), battery module information for the BMS. Battery module information may be data captured, measured, or monitored by a battery component monitor. Examples of battery module information include but are not limited to: battery sensor and usage data. Receiving (2402) from a battery management system (BMS), by a vehicle control system (2401), battery module information for the BMS may be carried out by receiving one or more signals from the BMS.

In addition, the method of FIG. 24 also includes generating (2404), by the vehicle control system (2401), vehicle information. Vehicle information may include location data and vehicle speed data from vehicle sensors. Generating (2404), by the vehicle control system (2401), vehicle information may be carried out by capturing and receiving data from vehicle sensors.

The method of FIG. 24 also includes generating (2406), by the vehicle control system (2401), backup data that includes the vehicle information and the battery module information for the BMS. Generating (2406), by the vehicle control system (2401), backup data that includes the vehicle information and the battery module information for the BMS may be carried out by packaging, pairing, combing, or otherwise associating the vehicle information and the battery module information.

Finally, the method of FIG. 24 also includes providing (2408), by the vehicle control system (2401), the data to an external device. Providing (2408), by the vehicle control system (2401), the data to an external device may be carried out by transmitting the backup data to a cloud server, a diagnostic tool, or a mobile device.

In view of the explanations set forth above, readers will recognize that the benefits of lifetime battery tracking using a wireless interface according to embodiments of the present disclosure include, but are not limited to:

Improved tracking of a battery module over the life of the battery, from production to operation, using the wireless interface of the wireless battery management system.

Improved location tracking of battery modules during assembly and production based on wireless signal strength.

Improved battery usage tracking and analysis through the preservation of battery usage data and associated vehicle operating conditions by offloading data.

Exemplary embodiments of the present invention are described largely in the context of a fully functional computer system for lifetime battery tracking using a wireless interface. Readers of skill in the art will recognize, however, that the present invention also may be embodied in a computer program product disposed upon computer readable storage media for use with any suitable data processing system. Such computer readable storage media may be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the invention as embodied in a computer program product. Persons skilled in the art will recognize also that, although some of the exemplary embodiments described in this specification are oriented to software installed and executing on computer hardware, nevertheless, alternative embodiments implemented as firmware or as hardware are well within the scope of the present invention.

The present invention may be a system, an apparatus, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Advantages and features of the present disclosure can be further described by the following statements:

1. A method for lifetime battery tracking using a wireless interface, the method comprising: receiving, by a battery component monitor, a first set of signals from a first set of access points (APs) of a plurality of APs; subsequent to receiving the first set of signals, receiving, by the battery component monitor, a second set of signals from a second set of APs of the plurality of APs; determining, by the battery component monitor, whether first information associated with the first set of signals is different than second information associated with the second set of signals; and in response to determining that the first information is different than the second information, broadcasting to one or more APs of the plurality of APs, by the battery component monitor, a signal that indicates a unique identifier for the battery component monitor.

2. The method of statement 1, wherein the first information indicates for each AP of the first set of APs, a strength of the received signal from the AP relative to the received signals of the other APs of the first set of APs; and wherein the second information indicates for each AP of the second set of APs, a strength of the received signal from the AP relative to the received signals of the other APs of the second set of APs.

3. The method of statement 1 or 2, wherein the first information indicates for each AP of the first set of APs, a strength of the received signal from the AP; and wherein the second information indicates for each AP of the second set of APs, a strength of the received signal from the AP.

4. The method of any of statements 1-3, wherein the first information indicates for each received signal of the first set of received signals, a strength of the received signal relative to the other received signals of the first set of received signals; and wherein the second information indicates for each received signal of the second set of received signals, a strength of the received signal relative to the other received signals of the second set of received signals.

5. The method of any of statements 1-4, further comprising: for each received signal of the first set of signals and the second set of signals: determining, by the battery component monitor, a received signal indicator (RSSI) value of the received signal; based on the determined RSSI values of each received signal of the first set of signals, storing as the first information, by the battery component monitor, data indicating for each AP of the first set of APs, a strength of the received signal from the AP; and based on the determined RSSI values of each received signal of the second set of signals, storing as the second information, by the battery component monitor, data indicating for each AP of the second set of APs, a strength of the received signal from the AP.

6. The method of any of statements 1-5, further comprising: for each received signal of the first set of signals and the second set of signals: determining, by the battery component monitor, a received signal indicator (RSSI) value of the received signal; based on the determined RSSI values of each received signal of the first set of signals, storing as the first information, by the battery component monitor, data indicating the strength of each received signal of the first set of signals; and based on the determined RSSI values of each received signal of the second set of signals, storing as the second information, by the battery component monitor, data indicating the strength of each received signal of the second set of signals.

7. The method of any of statements 1-6, wherein the battery component monitor is one of: a cell monitoring unit (CMU), a module monitoring system (MMS), a wireless network controller (WNC), and a battery management system (BMS).

8. The method of any of statements 1-7, further comprising: periodically waking up and scanning, by the battery component monitor, a plurality of frequency channels for signals from the plurality of APs.

9. The method of any of statements 1-8, further comprising: wirelessly connecting, by the battery component monitor, to a battery management system (BMS) network; and switching, by the battery component monitor, from a location monitoring mode to an operation mode.

10. The method of any of statements 1-9 further comprising receiving from a battery component monitor, by an access point (AP), a signal indicating the battery component monitor has detected a change in data received from a plurality of APs, the plurality of APs including the AP, the signal including a unique identifier for the battery component monitor; determining, by the AP, a strength of the signal from the battery component monitor; and in response to receiving the signal indicating the battery component monitor has detected a change in data received from the plurality of APs, transmitting to a tracking controller, by the AP, the unique identifier and an indication of the determined strength of the signal from the battery component monitor.

11. The method of any of statements 1-10, further comprising: broadcasting, by the AP, a signal to the battery component monitor.

12. A method of any of statements 1-11 further comprising for each access point (AP) of one or more APs, receiving from the AP, by a tracking controller, a set of data that includes received signal strength indicator (RSSI) information that indicates the strength of a signal received by the AP from a first battery component monitor; and in dependence upon the sets of data received from the one or more APs, determining, by the tracking controller, a location of the first battery component monitor.

13. The method of any of statements 1-12, wherein in dependence upon each set of data received from the one or more APs, determining, by the tracking controller, a location of the particular battery component monitor includes using location estimation algorithms to identify the location of the particular battery component monitor.

14. The method of any of statements 1-13, wherein the location estimation algorithms include at least one of triangulation and trilateration.

15. The method of any of statements 1-14, wherein in dependence upon each set of data received from the one or more APs, determining, by the tracking controller, a location of the particular battery component monitor includes in dependence upon a known location of each AP of the one or more APs and each set of data received from the one or more APs, determining, by the tracking controller, a location of the particular battery component monitor.

16. The method of any of statements 1-15, further comprising: for each access point (AP) of the one or more APs, receiving from the AP, by the tracking controller, a set of data that includes received signal strength indicator (RSSI) information that indicates the strength of a signal received by the AP from a second battery component monitor; and in dependence upon the sets of data received from the one or more APs, determining, by the tracking controller, a second location of the second battery component monitor.

17. The method of any of statements 1-16 further comprising: associating, by the tracking controller, the first battery component monitor with the second battery component monitor.

18. The method of any of statements 1-17 further comprising: determining, by the tracking controller, that the first location and the second location are within a predetermined proximity to each other; and in response to determining that the first location and the second location are within a predetermined proximity to each other, associating, by the tracking controller, the first battery component monitor with the second battery component monitor.

19. The method of any of statements 1-18, wherein each set of data includes at least one of: a unique identifier of a battery component and a unique identifier of a battery pack that includes a plurality of components.

20. The method of any of statements 1-19, wherein each set of data includes a unique identifier of a particular battery component.

21. The method of any of statements 1-20 further comprising: receiving from a battery management system (BMS), by a vehicle control system, battery module information for the BMS; generating, by the vehicle control system, vehicle information; generating, by the vehicle control system, backup data that includes the vehicle information and the battery module information for the BMS; and providing, by the vehicle control system, the backup data to an external device.

22. The method of any of statements 1-21, wherein the vehicle information includes location data and vehicle speed data from vehicle sensors.

23. The method of any of statements 1-22, wherein the external device is at least one of a cloud server, a diagnostic tool, and a mobile device.

One or more embodiments may be described herein with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

While particular combinations of various functions and features of the one or more embodiments are expressly described herein, other combinations of these features and functions are likewise possible. The present disclosure is not limited by the particular examples disclosed herein and expressly incorporates these other combinations.

What is claimed is:

1. A method for lifetime battery tracking using a wireless interface, the method comprising:
   receiving, by a module monitoring system (MMS) functioning in a location monitoring mode, a first set of signals from a first set of access points (APs) of a plurality of APs, wherein two or more of the plurality of APs are distributed along a battery pack production line of a battery pack assembly facility;
   subsequent to receiving the first set of signals, receiving, by the MMS functioning in the location monitoring mode, a second set of signals from a second set of APs of the plurality of APs;
   determining, by the MMS functioning in the location monitoring mode, whether first information associated with the first set of signals is different than second information associated with the second set of signals;
   in response to determining that the first information is different than the second information, broadcasting to one or more APs of the plurality of APs, by the MMS functioning in the location monitoring mode, a signal that indicates a unique identifier for the MMS;
   wirelessly connecting, by the MMS, to a battery management system (BMS) network of a battery pack during assembly of the battery pack along the battery pack production line, wherein the MMS is one of a plurality of MMSs permanently installed in the battery pack and connected to the BMS network, and wherein the MMS wirelessly communicates with a BMS network controller that is a component of the battery pack; and
   in response to wirelessly connecting to the BMS network, switching, by the MMS, from functioning in the location monitoring mode to functioning in an operation mode in which the MMS ceases location monitoring, wherein the BMS network controller functions in the location monitoring mode.

2. The method of claim 1, wherein the first information indicates for each AP of the first set of APs, a strength of the received signal from the AP relative to the received signals of the other APs of the first set of APs; and wherein the second information indicates for each AP of the second set of APs, a strength of the received signal from the AP relative to the received signals of the other APs of the second set of APs.

3. The method of claim 1, wherein the first information indicates for each AP of the first set of APs, a strength of the received signal from the AP; and wherein the second information indicates for each AP of the second set of APs, a strength of the received signal from the AP.

4. The method of claim 1, wherein the first information indicates for each received signal of the first set of received signals, a strength of the received signal relative to the other received signals of the first set of received signals; and wherein the second information indicates for each received signal of the second set of received signals, a strength of the received signal relative to the other received signals of the second set of received signals.

5. The method of claim 1 further comprising:
for each received signal of the first set of signals and the second set of signals: determining, by the MMS, a received signal indicator (RSSI) value of the received signal;
based on the determined RSSI values of each received signal of the first set of signals, storing as the first information, by the MMS, data indicating for each AP of the first set of APs, a strength of the received signal from the AP; and
based on the determined RSSI values of each received signal of the second set of signals, storing as the second information, by the MMS, data indicating for each AP of the second set of APs, a strength of the received signal from the AP.

6. The method of claim 1 further comprising:
for each received signal of the first set of signals and the second set of signals: determining, by the MMS, a received signal indicator (RSSI) value of the received signal;
based on the determined RSSI values of each received signal of the first set of signals, storing as the first information, by the MMS, data indicating the strength of each received signal of the first set of signals; and
based on the determined RSSI values of each received signal of the second set of signals, storing as the second information, by the MMS, data indicating the strength of each received signal of the second set of signals.

7. The method of claim 1 further comprising:
in the location monitoring mode, periodically waking up and scanning, by the MMS, a plurality of frequency channels for signals from the plurality of APs.

8. The method of claim 1, wherein the BMS network controller functions in the location monitoring mode by broadcasting a signal that indicates a unique identifier for the BMS network controller.

9. The method of claim 1, wherein the MMS is associated with the BMS network controller by a tracking controller based on a location of the MMS being within a predetermined proximity to a location of the BMS network controller.

10. A method of lifetime battery tracking using a wireless interface, the method comprising:
receiving from a module monitoring system (MMS) of a battery module, by an access point (AP) among a plurality of APs distributed along a battery pack production line of a battery pack production facility, a first signal indicating the MMS has detected a change in data received from a plurality of APs, the plurality of APs including the AP, the first signal including a unique identifier for the MMS;
determining, by the AP, a strength of the first signal from the MMS;
in response to receiving the first signal indicating the MMS has detected a change in data received from the plurality of APs, transmitting to a tracking controller, by the AP, the unique identifier and an indication of the determined strength of the first signal from the MMS; and
receiving, by the AP subsequent to receiving the first signal, a second signal from a battery management system (BMS) network controller that is a component of an electric battery pack in which the MMS has been permanently installed, the second signal including a unique identifier for the BMS network controller, wherein the MMS has discontinued a location monitoring mode in response to wirelessly connecting to the BMS network controller during battery pack assembly along the battery pack production line.

11. The method of claim 10 further comprising: broadcasting, by the AP, a signal to the MMS.

12. The method of claim 10, wherein the MMS is associated with the BMS network controller by the tracking controller based on a location of the MMS being within a predetermined proximity to a location of the BMS network controller.

13. A computer program product for lifetime battery tracking using a wireless interface, the computer program product including a non-transitory computer readable storage medium that includes computer program instructions that when executed by a computer processor cause the computer processor to carry out the operations of:
receiving, by a module monitoring system (MMS) functioning in a location monitoring mode, a first set of signals from a first set of access points (APs) of a plurality of APs, wherein two or more of the plurality of APs are distributed along a battery pack production line of a battery pack assembly;
subsequent to receiving the first set of signals, receiving, by the MMS functioning in the location monitoring mode, a second set of signals from a second set of APs of the plurality of APs;
determining, by the MMS functioning in the location monitoring mode, whether first information associated with the first set of signals is different than second information associated with the second set of signals;
in response to determining that the first information is different than the second information, broadcasting to one or more APs of the plurality of APs, by the MMS functioning in the location monitoring mode, a signal that indicates a unique identifier for the MMS;
wirelessly connecting, by the MMS, to a battery management system (BMS) network of a battery pack during assembly of the battery pack along the battery pack production line, wherein the MMS is one of a plurality of MMSs permanently installed in the battery pack and connected to the BMS network, and wherein the MMS wirelessly communicates with a BMS network controller that is a component of the battery pack; and
in response to wirelessly connecting to the BMS network, switching, by the MMS, from functioning in the location monitoring mode to functioning in an operation mode in which the MMS ceases location monitoring, wherein the BMS network controller functions in the location monitoring mode.

14. The computer program product of claim 13, wherein the first information indicates for each AP of the first set of APs, a strength of the received signal from the AP relative to the received signals of the other APs of the first set of APs; and wherein the second information indicates for each AP of the second set of APs, a strength of the received signal from the AP relative to the received signals of the other APs of the second set of APs.

15. The computer program product of claim 13, wherein the first information indicates for each AP of the first set of APs, a strength of the received signal from the AP; and wherein the second information indicates for each AP of the second set of APs, a strength of the received signal from the AP.

16. The computer program product of claim 13, wherein the first information indicates for each received signal of the first set of received signals, a strength of the received signal relative to the other received signals of the first set of received signals; and wherein the second information indicates for each received signal of the second set of received signals, a strength of the received signal relative to the other received signals of the second set of received signals.

17. The computer program product of claim 13 further comprising computer program instructions that when executed by the computer processor cause the computer processor to carry out the operations of:

for each received signal of the first set of signals and the second set of signals: determining, by the MMS, a received signal indicator (RSSI) value of the received signal;

based on the determined RSSI values of each received signal of the first set of signals, storing as the first information, by the MMS, data indicating for each AP of the first set of APs, a strength of the received signal from the AP; and based on the determined RSSI values of each received signal of the second set of signals, storing as the second information, by the MMS, data indicating for each AP of the second set of APs, a strength of the received signal from the AP.

18. The computer program product of claim 13 further comprising computer program instructions that when executed by the computer processor cause the computer processor to carry out the operations of:

for each received signal of the first set of signals and the second set of signals: determining, by the MMS, a received signal indicator (RSSI) value of the received signal;

based on the determined RSSI values of each received signal of the first set of signals, storing as the first information, by the MMS, data indicating the strength of each received signal of the first set of signals; and based on the determined RSSI values of each received signal of the second set of signals, storing as the second information, by the MMS, data indicating the strength of each received signal of the second set of signals.

19. The computer program product of claim 13 further comprising computer program instructions that when executed by the computer processor cause the computer processor to carry out the operations of:

in the location monitoring mode, periodically waking up and scanning, by the MMS, a plurality of frequency channels for signals from the plurality of APs.

20. The computer program product of claim 13, wherein the MMS is associated with the BMS network controller by the tracking controller based on a location of the MMS being within a predetermined proximity to a location of the BMS network controller.

\* \* \* \* \*